(12) United States Patent
Kang et al.

(10) Patent No.: US 11,672,150 B2
(45) Date of Patent: Jun. 6, 2023

(54) DISPLAY APPARATUS

(71) Applicant: Samsung Display Co., Ltd., Yongin-si (KR)

(72) Inventors: Jangmi Kang, Yongin-si (KR); Dongwoo Kim, Yongin-si (KR); Minjae Jeong, Yongin-si (KR); Jaeyong Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 498 days.

(21) Appl. No.: 16/928,575

(22) Filed: Jul. 14, 2020

(65) Prior Publication Data
US 2021/0098552 A1    Apr. 1, 2021

(30) Foreign Application Priority Data

Sep. 27, 2019   (KR) .................. 10-2019-0119611

(51) Int. Cl.
*H01L 27/00*   (2006.01)
*H01L 27/32*   (2006.01)

(52) U.S. Cl.
CPC ........ *H01L 27/3276* (2013.01); *H01L 27/323* (2013.01)

(58) Field of Classification Search
CPC .................. H01L 27/3276; H01L 27/323
See application file for complete search history.

(56) References Cited

U.S. PATENT DOCUMENTS

| 7,439,939 B2 | 10/2008 | Yun et al. |
| 9,257,493 B2 | 2/2016 | Lee et al. |
| 9,430,180 B2 | 8/2016 | Hirakata et al. |
| 2018/0074361 A1 | 3/2018 | Chung et al. |
| 2019/0348491 A1* | 11/2019 | Chung ............... H01L 27/0296 |
| 2021/0273035 A1* | 9/2021 | Cho .................... H01L 27/3272 |

FOREIGN PATENT DOCUMENTS

| KR | 2001-0047907 | 6/2001 |
| KR | 10-2005-0028386 | 3/2005 |
| KR | 10-2014-0077002 | 6/2014 |
| KR | 10-2018-0030325 | 3/2018 |
| KR | 10-2020-0010697 | 1/2020 |

* cited by examiner

*Primary Examiner* — Reema Patel
(74) *Attorney, Agent, or Firm* — Kile Park Reed & Houtteman PLLC

(57) ABSTRACT

A display apparatus includes a data line, a first voltage line extending in parallel to the data line, a scan line extending in a direction perpendicular to the data line, a second voltage line extending in parallel to the scan line, and a line extending in parallel to the data line or the scan line. A portion of the line parallel to the scan line overlaps the second voltage line.

23 Claims, 27 Drawing Sheets

FIG. 15B
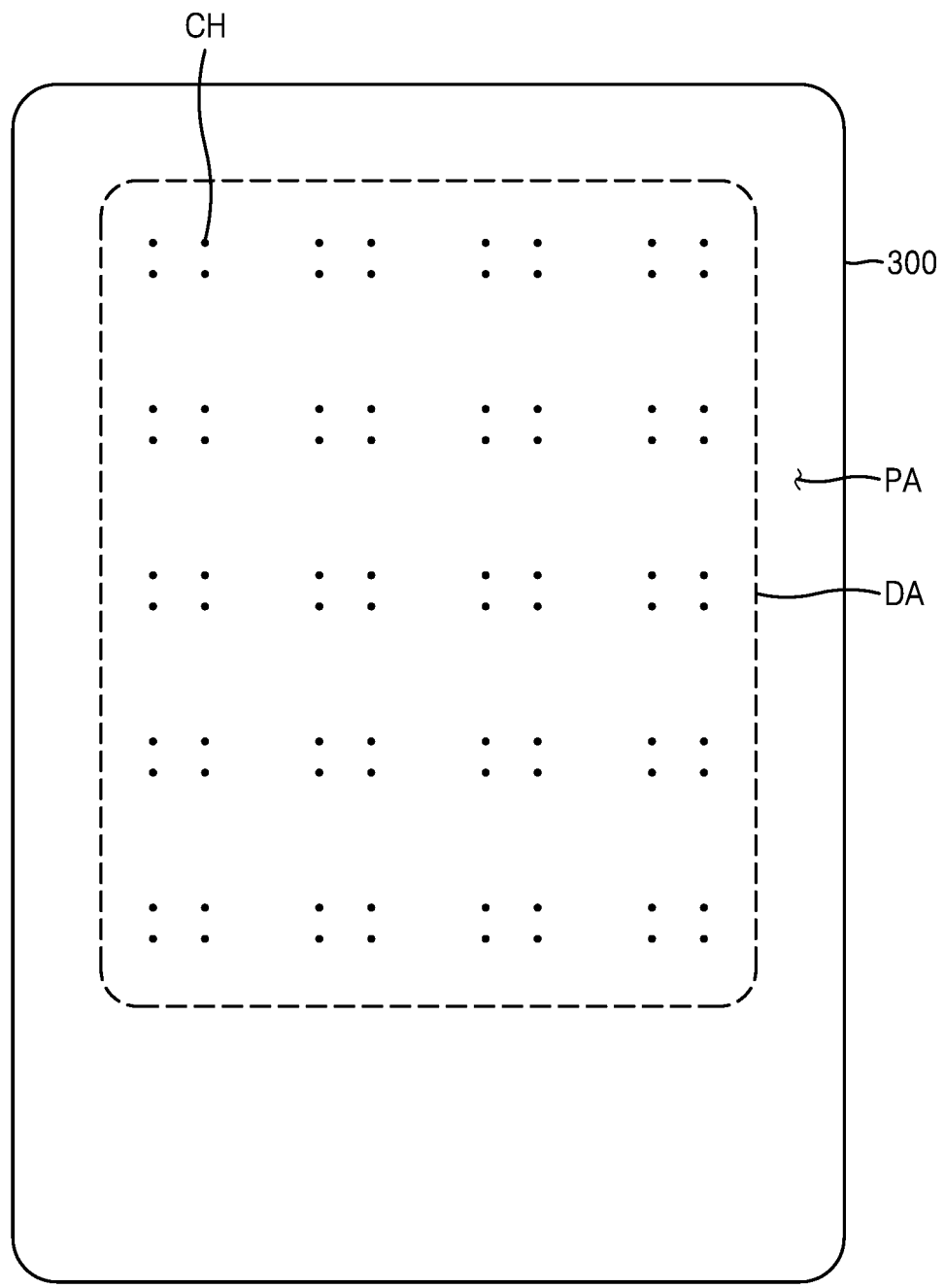
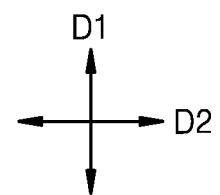

DISPLAY APPARATUS

CROSS-REFERENCE TO RELATED APPLICATION(S)

This application claims priority to and benefits of Korean Patent Application No. 10-2019-0119611 under 35 U.S.C. § 119, filed in the Korean Intellectual Property Office on Sep. 27, 2019, the entire contents of which are incorporated herein by reference.

BACKGROUND

1. Technical Field

One or more embodiments relate to a display apparatus.

2. Description of Related Art

With the rapid development in the field of displays for visually expressing a variety of information, various displays having excellent characteristics such as slimness, light weight, and low power consumption have been introduced. Recently, in displays, dead areas are being reduced and the area occupied by display areas is being increased.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus, in which a dead area or dead space may be reduced and pattern recognition in a display area may be prevented.

Additional aspects will be set forth in part in the description which follows and, in part, will be apparent from the description, or may be learned by practice of the embodiments of the disclosure.

According to one or more embodiments, a display apparatus may include a substrate including a display area in which display elements may be disposed and a peripheral area outside the display area, a data line disposed in the display area of the substrate, a first voltage line extending in parallel to the data line, a scan line extending in a direction perpendicular to the data line, a second voltage line extending in parallel to the scan line, and a line disposed in the display area of the substrate, and extending in parallel to the data line or the scan line, wherein the second voltage line is disposed on a layer between the scan line and the line, and a portion of the line parallel to the scan line overlaps the second voltage line.

The line may include a segment protruding in a direction perpendicular to an extension direction of the line, and the segment of the line may be a branch.

A width of the second voltage line may be greater than a width of the line.

The second voltage line may be spaced apart from the scan line.

The first voltage line may be disposed on a layer between the scan line and the line, and include a protrusion protruding in an extension direction of the scan line and overlapping the scan line.

The first voltage line and the second voltage line may be disposed on different layers.

The display apparatus may further include a first transistor including a first semiconductor layer and a first gate electrode, a second transistor including a second semiconductor layer and a second gate electrode, one end of the second semiconductor layer being electrically connected to the first gate electrode of the first transistor, a node electrode electrically connected to the first gate electrode of the first transistor and the one end of the second semiconductor layer of the second transistor, and an electrode pattern electrically connected to the first voltage line and overlapping the node electrode, the electrode pattern and the line being disposed on a same layer.

The display apparatus may further include a sensing electrode disposed above the line, wherein the sensing electrode may include a grid line, and the grid line may overlap an end portion of the segment of the line.

According to one or more embodiments, a display apparatus may include a substrate including a display area in which display elements may be disposed and a peripheral area outside the display area, a data line disposed in the display area of the substrate, a first voltage line extending in parallel to the data line, a scan line extending in a direction perpendicular to the data line, a second voltage line extending in parallel to the scan line, and a line disposed in the display area of the substrate, extending in parallel to the data line, and including a segment protruding in the direction perpendicular to the data line and overlapping the second voltage line, wherein the second voltage line is disposed on a layer between the scan line and the line.

The segment of the line may be a branch.

A width of the second voltage line may be greater than a width of the line.

The second voltage line may be spaced apart from the scan line.

The first voltage line may be disposed on a layer between the scan line and the line, and include a protrusion protruding in an extension direction of the scan line and overlapping the scan line.

The first voltage line and the second voltage line may be disposed on different layers.

The display apparatus may further include a sensing electrode disposed above the line, wherein the sensing electrode may include a grid line, and the grid line may overlap an end portion of the segment of the line.

The display apparatus may further include a second data line spaced apart from the data line, wherein the line may be electrically connected to the data line or the second data line.

According to one or more embodiments, a display apparatus may include a substrate including a display area in which display elements may be disposed and a peripheral area outside the display area, a data line disposed in the display area of the substrate, a first voltage line extending in parallel to the data line, a scan line extending in a direction perpendicular to the data line, a second voltage line extending in parallel to the scan line, and a line disposed in the display area of the substrate, extending in parallel to the scan line, overlapping the second voltage line, and including a segment protruding in the direction of the data line, wherein the second voltage line is disposed on a layer between the scan line and the line.

The segment of the line may be a branch.

A width of the second voltage line may be greater than a width of the line.

The second voltage line may be spaced apart from the scan line.

The first voltage line may be disposed on a layer between the scan line and the line, and include a protrusion protruding in an extension direction of the scan line and overlapping the scan line.

The first voltage line and the second voltage line may be disposed on different layers.

The display apparatus may further include a sensing electrode disposed above the line, wherein the sensing electrode may include a grid line, and the grid line may overlap an end portion of the segment of the line.

BRIEF DESCRIPTION OF THE DRAWINGS

The above and other aspects, features, and advantages of embodiments of the disclosure will be more apparent from the following description taken in conjunction with the accompanying drawings, in which:

FIGS. 15A to 15D are plan views of input sensing layers on a layer basis;

DETAILED DESCRIPTION OF THE EMBODIMENTS

Figure 1:
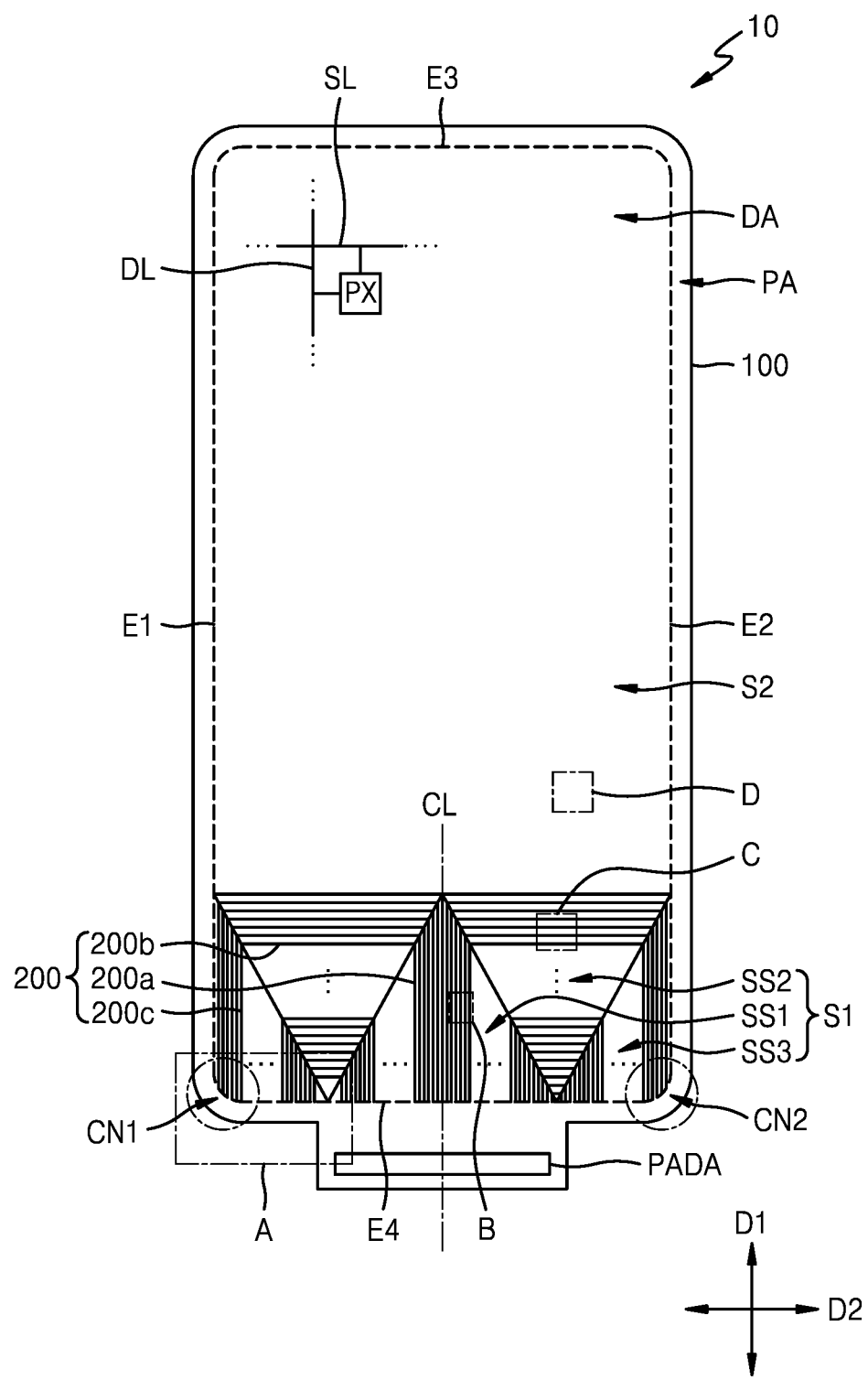
FIG. 1 is a plan view schematically illustrating an example of a display panel according to an embodiment.

Reference will now be made in detail to embodiments, examples of which are illustrated in the accompanying drawings, wherein like reference numerals refer to like elements throughout. It is to be understood that the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements. However, these elements should not be limited by these terms. These terms are only used to distinguish one element from another.

As used herein, the singular forms "a," "an" and "the" are intended to include the plural forms as well, unless the context clearly indicates otherwise.

It will be further understood that the terms "comprises" and/or "comprising", "includes" and/or "including" used herein specify the presence of stated features or elements, but do not preclude the presence or addition of one or more other features or elements.

It will be understood that when a layer, region, or element is referred to as being "formed on," another layer, region, or element, it can be directly or indirectly formed on the other layer, region, or element. That is, for example, intervening layers, regions, or elements may be present.

Sizes of elements in the drawings may be exaggerated for convenience of explanation. In other words, since sizes and thicknesses of elements in the drawings are arbitrarily illustrated for convenience of explanation, the following embodiments are not limited thereto.

In this specification, the expression "A and/or B" indicates only A, only B, or both A and B. Throughout the disclosure, the expression "at least one of A or B" indicates only A, only B, or both A and B.

In the following embodiments, the expression "a line extends in a "first direction" or a "second direction" as used herein may include not only a case in which a line extends in a substantially linear shape but also a case in which a line extends in a substantially zigzag or a substantially curved shape along the first direction or the second direction.

In the following embodiments, the expression "when seen in a plan view" as used herein may indicate a case in which an object is seen from above, and the expression "when seen in a schematic cross-sectional view" as used herein may indicate a case in which a cross section obtained by cutting an object vertically is seen from the side. In the following embodiments, the term "overlapping" may include overlapping "when seen in a plan view" and "when seen in a schematic cross-sectional view."

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the disclosure will be described in detail with reference to the accompanying drawings. When embodiments of the disclosure are described with reference to the accompanying drawings, the same reference numerals are assigned to the same or corresponding components.

Figure 2:
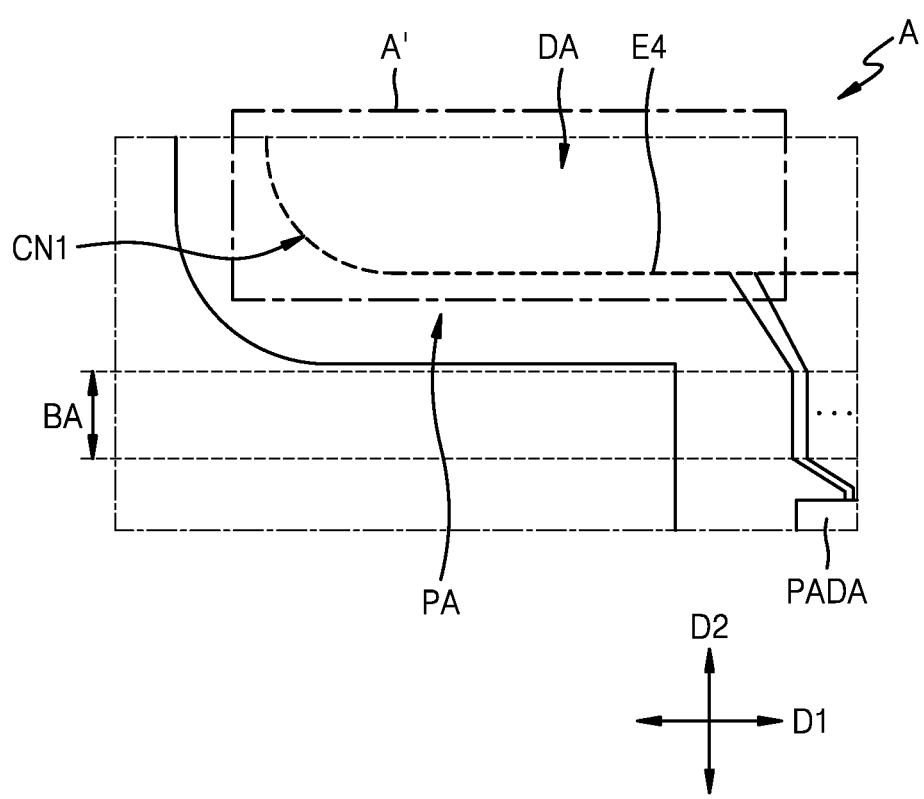
FIG. 2 is a conceptual diagram schematically illustrating portion A of FIG. 1.
Figure 3:
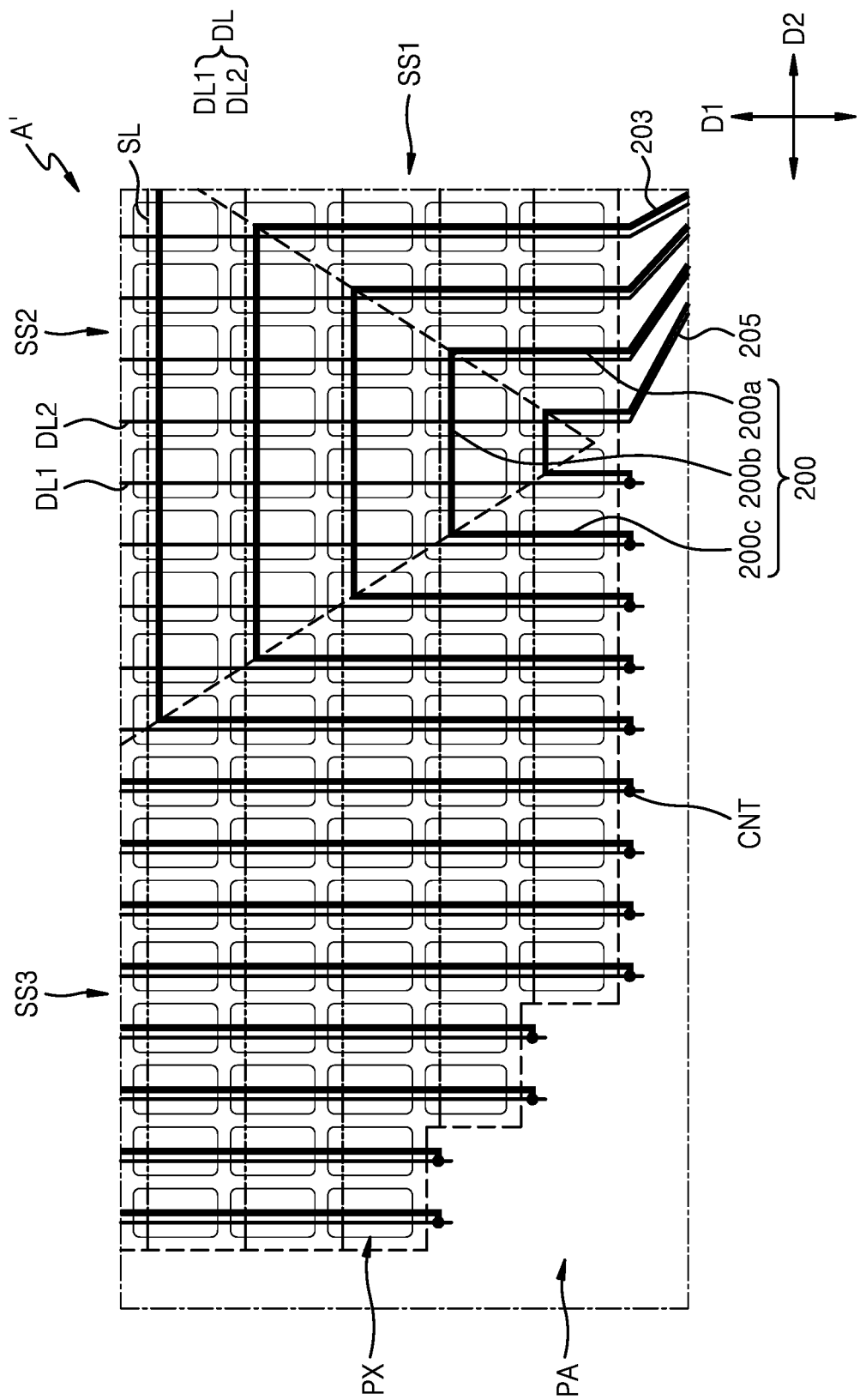
FIG. 3 is a partial enlarged plan view of portion A' of FIG. 2.

FIG. 1 is a plan view schematically illustrating an example of a display panel 10 according to an embodiment. FIG. 2 is a conceptual diagram schematically illustrating a portion A of FIG. 1, and FIG. 3 is a partial enlarged plan view of a portion A' of FIG. 2.

Referring to FIG. 1, a display apparatus according to an embodiment may include the display panel 10 including a substrate 100. The display panel 10 may have a display area DA and a peripheral area PA that may be arranged, located or disposed outside the display area DA. The substrate 100 may have a display area DA and a peripheral area PA respectively corresponding to the display area DA and the peripheral area PA of the display panel 10.

An edge of the display area DA may have a shape substantially similar to a rectangle or a square as a whole. As illustrated in FIGS. 1 and 2, a first corner CN1 at an edge of the display area DA may have a substantially round shape. For example, the display area DA may include a first edge E1 and a second edge E2 facing each other, and a third edge E3 and a fourth edge E4 arranged, located or disposed between the first edge E1 and the second edge E2 and facing each other. A pad area PADA may be adjacent to the fourth edge E4 among the first to fourth edges E1 to E4. For example, the first corner CN1 having a substantially round shape may connect the first edge E1 to the fourth edge E4. The second corner CN2 at an edge of the display area DA other than the first corner CN1 may have a substantially round shape. The second corner CN2 may connect the second edge E2 to the fourth edge E4. The display area DA may also have a substantially round shape in a portion of the edge other than the corners.

The peripheral area PA may surround the display area DA. The peripheral area PA may be an area in which no pixels PX are arranged, located or disposed. The peripheral area PA may include the pad area PADA to which various electronic elements, printed circuit boards, or the like may be electrically attached. Voltage lines or the like that supply power for driving display elements may be arranged, or located or disposed in the peripheral area PA. The pad area PADA may include pads. The pads may be electrically connected to a data driver. In an embodiment, the data driver that may supply a data signal may be arranged, located or disposed on a film that may be electrically connected to the pads of the pad area PADA in a chip on film (COF) manner. In one or more embodiments, the data driver may be directly arranged located or disposed on the substrate 100 in a chip on glass (COG) or chip on plastic (COP) manner.

FIG. 1 is a plan view illustrating an example of the substrate 100 during the process of manufacturing the display apparatus. In a final display apparatus or an electronic device such as a smartphone including a display apparatus, a part of the substrate 100 may be bent to minimize the area of the peripheral area PA recognized by a user.

As illustrated in FIG. 2, the peripheral area PA may include a bending area BA. The bending area BA may be arranged located or disposed between the pad area PADA and the display area DA. The substrate 100 may be bent in the bending area BA so that at least part of the pad area PADA may be arranged located or disposed to overlap the display area DA. A bending direction may be set so that the pad area PADA may not cover the display area DA and the pad area PADA may be arranged located or disposed behind the display area DA. Therefore, the user may recognize that the display area DA occupies most of the display apparatus.

FIG. 3 illustrates a part of the first corner CN1. When observed in a general use environment by the user, the display apparatus according to an embodiment or the electronic device including the same may be recognized as having a substantially round shape, for example, a substantially curved shape. However, in an environment in which lines having a width of several micrometers or tens of micrometers are observed by enlarging the first corner CN1, as illustrated in FIG. 3, it may appear that the first corner CN1 has a substantially linear shape bent a plurality of times in a first direction D1 and a second direction D2. Even when the first corner CN1 may be enlarged and it may appear that the first corner CN1 has a substantially linear shape bent a plurality of times as illustrated in FIG. 3, the first corner CN1 may be recognized as having a substantially round shape, for example, a substantially curved shape in a general use environment. Therefore, when the first corner CN1 and the second corner CN2 have a substantially round shape, it may include both a case in which the first corner CN1 and the second corner CN2 have a substantially round shape and a case in which the first corner CN1 and the second corner CN2 have a substantially linear shape bent a plurality of times.

Pixels PX and signal lines that may apply electric signals to the pixels PX may be arranged located or disposed in the display area DA.

Each of the pixels PX may include a display element and a pixel circuit that drives the display element. For example, the display element may be an organic light-emitting diode, and the pixel circuit may include transistors and capacitors. The pixels PX may include first pixels that may emit first color light, second pixels that may emit second color light, and third pixels that may emit third color light. For example, the first pixel may be a red pixel (R), the second pixel may be a green pixel (G), and the third pixel may be a blue pixel (B). However, the disclosure is not limited thereto.

The signal lines, may be capable of applying electric signals to the pixels PX, may include scan lines SL, data lines DL, and the like. Each of the data lines DL may extend in the first direction D1, and each of the scan lines SL may extend in the second direction D2. For example, the scan lines SL may be arranged located or disposed in rows that may transfer a scan signal to the pixels PX. For example, the data lines DL may be arranged located or disposed in columns and may transfer a data signal to the pixels PX. Each of the pixels PX may be electrically connected to at least one corresponding scan line SL among the scan lines SL and the corresponding data line DL among the data lines DL. However, the disclosure is not limited thereto. As illustrated in FIG. 3, the data lines DL may include first data lines DL1 and second data lines DL2. The first data lines DL1 may be data lines electrically connected to first lines 200 to be described below. The second data lines DL2 may be data lines other than the first data lines DL1.

The first lines 200 may transfer an electric signal supplied from the pad area PADA to the signal lines electrically connected to the pixels PX may be arranged located or disposed in the display area DA. For example, the first lines 200 may be electrically connected to the first data lines DL1 may transfer the data signal supplied from the pads of the pad area PADA to the first data lines DL1. Each of the first lines 200 may be arranged located or disposed at a layer different from those of the scan lines SL and the data lines DL of the pixels PX.

The first lines 200 may be arranged located or disposed on the left side of a virtual center line CL passing through substantially the center of the display panel 10 in the second direction D2 and the first lines 200 arranged located or disposed on the right side of the center line CL may be substantially bilaterally symmetrical with respect to the center line CL.

Each of the first lines 200 may include a first portion 200a and a third portion 200c extending in the first direction D1 and a second portion 200b extending in the second direction D2. The second portion 200b may connect the first portion 200a to the third portion 200c. The first portion 200a, the second portion 200b, and the third portion 200c may be integrally formed. The first portion 200a may be arranged located or disposed at around the center line CL, and the third portion 200c may be arranged located or disposed at the first and second corners CN1 and CN2. The first portion 200a may be away from the pad area PADA from the fourth edge E4 facing the pad area PADA and extend in the first direction D1. The second portion 200b may be bent at the first portion 200a to face the first edge E1 or the second edge E2 and extend in the second direction D2. The third portion 200c may be bent at the second portion 200b to face the fourth edge E4 and extend in the first direction D1. However, the disclosure is not limited thereto.

The display area DA may be divided into areas according to the presence or absence of arrangement of the first lines 200. For example, the display area DA may include a first area S1 in which the first lines 200 may be arranged located or disposed and a second area S2 other than the first area S1. The second area S2 may be an area in which the first lines 200 may not be arranged located or disposed.

The first area S1 may be divided into sub-areas along the extension direction of the first lines 200. For example, the first area S1 may include a first sub-area SS1 in which the first portions 200a of the first lines 200 may be arranged located or disposed, a second sub-area SS2 in which the second portions 200b of the first lines 200 may be arranged located or disposed, and a third sub-area SS3 in which the third portions 200c of the first lines 200 may be arranged located or disposed. The first sub-area SS1, the second sub-area SS2, and the third sub-area SS3, which may be arranged located or disposed on the right side of the center line CL, may be substantially symmetrical with the first sub-area SS1, the second sub-area SS2, and the third sub-area SS3, which may be arranged located or disposed on the left side of the center line CL.

Referring to FIG. 3, the first portion 200a of each of the first lines 200 may be parallel to the second data line DL2, and may be arranged located or disposed to partially overlap the second data line DL2 or may be arranged located or disposed adjacent to the second data line DL2. The first portion 200a of each of the first lines 200 may extend in parallel to the second data line DL2 arranged located or disposed at one of the columns. The second portion 200b of each of the first lines 200 may be parallel to the scan line SL, and may be arranged located or disposed to partially overlap the scan line SL or may be arranged located or disposed adjacent to the scan line SL. The second portion 200b of each of the first lines 200 may extend in parallel to the scan line SL arranged located or disposed at one of the rows. The third portion 200c of each of the first lines 200 may be parallel to the first data line DL1, and may be arranged located or disposed to partially overlap the first data line DL1 or may be arranged located or disposed adjacent to the first data line DL1. The third portion 200c of each of the first lines 200 may extend in parallel to the first data line DL1 arranged located or disposed at one of the columns. It is to be understood that the arrangement of the first, second, and third portions 200a, 200b, and 200c may be in any arrangement with respect to the data and scan lines as would be appreciated by those of ordinary skill in the art.

A column at which the first portion 200a of each of the first lines 200 may be arranged located or disposed may be spaced apart from a column at which the third portion 200c of each of the first lines 200 may be arranged located or disposed by at least one column interval. The first portions 200a of the pair of first lines 200 adjacent to each other may be spaced apart from each other by at least one column interval. The third portions 200c of the pair of first lines 200 adjacent to each other may be spaced apart from each other by at least one column interval. The second portions 200b of the pair of first lines 200 adjacent to each other may be spaced apart from each other by at least one row interval.

As illustrated in FIG. 3, first connection lines 203 and second connection lines 205 may be arranged located or disposed in the peripheral area PA.

Each of the first lines 200 may have one end electrically connected to the first data line DL1 and the other end electrically connected to the first connection line 203. The first connection line 203 may have one end electrically connected to the other end of the first line 200 and the other end electrically connected to the pad of the pad area PADA. In an embodiment, the first connection line 203 may be a portion in which the first portion 200a of the first line 200 extends toward the peripheral area PA. In one or more embodiments, the first connection line 203 may be a separate line arranged located or disposed on a layer different from that of the first line 200 and may be electrically connected to the first portion 200a of the first line 200 in the peripheral area PA. The third portion 200c of the first line 200 may be electrically connected to the first data line DL1 in a contact portion CNT of the peripheral area PA. It is to be understood that the one or more embodiments are combinable within the spirit and scope of the disclosure.

The second connection line 205 may have one end electrically connected to the second data line DL2 and the other end electrically connected to the pad of the pad area PADA. In an embodiment, the second connection line 205 may be a portion in which the second data line DL2 extends toward the peripheral area PA. In one or more embodiments, the second connection line 205 may be a separate line arranged located or disposed on a layer different from that of the second data line DL2 and may be electrically connected to the second data line DL2 in the peripheral area PA.

Figure 4:
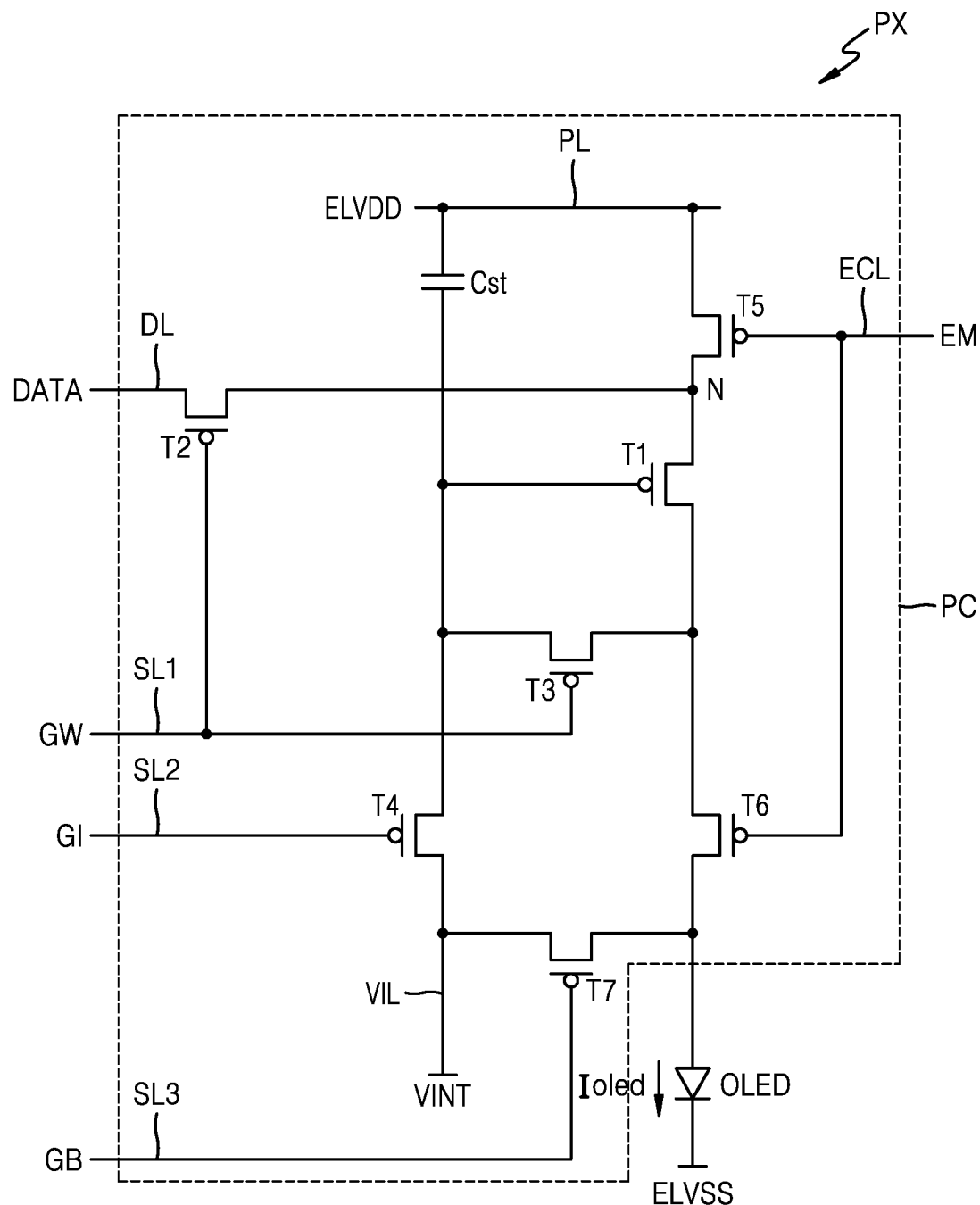
FIG. 4 is an equivalent circuit diagram illustrating a pixel located or disposed in a display panel, according to an embodiment.

FIG. 4 is an equivalent circuit diagram illustrating a pixel PX arranged located or disposed in the display panel 10, according to an embodiment.

A case in which signal lines SL1, SL2, SL3, ECL, and DL, an initialization voltage line VIL, and a power supply voltage line PL are provided for each pixel PX is illustrated in FIG. 4. In one or more embodiments, at least one of the signal lines SL1, SL2, SL3, ECL, and DL, the initialization voltage line VIL, and/or the power supply voltage line PL may be shared by the adjacent pixels.

The signal lines may include a first scan line SL1 that may transfer a first scan signal GW, a second scan line SL2 that may transfer a second scan signal GI, a third scan line SL3 that may transfer a third scan signal GB, an emission control line ECL that may transfer an emission control signal EM, and a data line DL that may transfer a data signal DATA. The third scan line SL3 may be a second scan line SL2 of a next row, and the third scan signal GB may be a second scan signal GI of a next row. However, the disclosure is not limited thereto.

The power supply voltage line PL may transfer a first power supply voltage ELVDD to a first transistor T1, and the initialization voltage line VIL may transfer an initialization voltage VINT for initializing the first transistor T1 and an organic light-emitting diode OLED.

The first scan line SL1, the second scan line SL2, the third scan line SL3, the emission control line ECL, and the initialization voltage line VIL may extend in the second direction D2 and may be spaced apart from each other at each row. The data line DL and the power supply voltage line PL may extend in the first direction D1 and may be spaced apart from each other at each column.

The pixel circuit PC of the pixel PX may include first to seventh transistors T1 to T7 and a capacitor Cst. The first to seventh transistors T1 to T7 may each be implemented by a thin-film transistor.

The first transistor T1 may be electrically connected to the power supply voltage line PL via the fifth transistor T5 and may be electrically connected to the organic light-emitting diode OLED via the sixth transistor T6. The first transistor T1 may serve as a driving transistor and may receive the data signal DATA according to a switching operation of the second transistor T2 and may supply a driving current Ioled to the organic light-emitting diode OLED.

The second transistor T2 may be electrically connected to the first scan line SL1 and the data line DL and may be turned on in response to the first scan signal GW received through the first scan line SL1 to perform a switching operation of transferring the data signal DATA received through the data line DL to a node N.

The third transistor T3 may be electrically connected to the organic light-emitting diode OLED via the sixth transistor T6. The third transistor T3 may be turned on in response to the first scan signal GW received through the first scan line SL1 to diode-connect the first transistor T1.

The fourth transistor T4 may be turned on in response to the second scan signal GI received through the second scan line SL2 to transfer the initialization voltage VINT received from the initialization voltage line VIL to a gate electrode of the first transistor T1, thereby initializing a gate voltage of the first transistor T1.

The fifth transistor T5 and the sixth transistor T6 may be simultaneously turned on in response to the emission control signal EM received through the emission control line ECL to form a current path so that the driving current flows in a direction from the power supply voltage line PL to the organic light-emitting diode OLED.

The seventh transistor T7 may be turned on in response to the third scan signal GB received through the third scan line SL3 to transfer the initialization voltage VINT received through the initialization voltage line VIL to the organic light-emitting diode OLED, thereby initializing the organic light-emitting diode OLED. The seventh transistor T7 may be omitted.

FIG. 4 illustrates an example in which the fourth transistor T4 may be electrically connected to the second scan line SL2 and the seventh transistor may be electrically connected to the separate third scan line SL3. In one or more embodiments, the seventh transistor T7 may be electrically connected to the second scan line SL2 together with the fourth transistor T4.

The capacitor Cst may be electrically connected to the power supply voltage line PL and the gate electrode of the first transistor T1 to store and maintain a voltage corresponding to a difference between voltages of both ends thereof. Therefore, a voltage applied to the gate electrode of the first transistor T1 may be maintained.

The organic light-emitting diode OLED may include a pixel electrode and a counter electrode, and the counter electrode may receive a second power supply voltage ELVSS. The organic light-emitting diode OLED may receive the driving current Ioled from the first transistor T1 and emit light to display an image or images.

Figure 5:
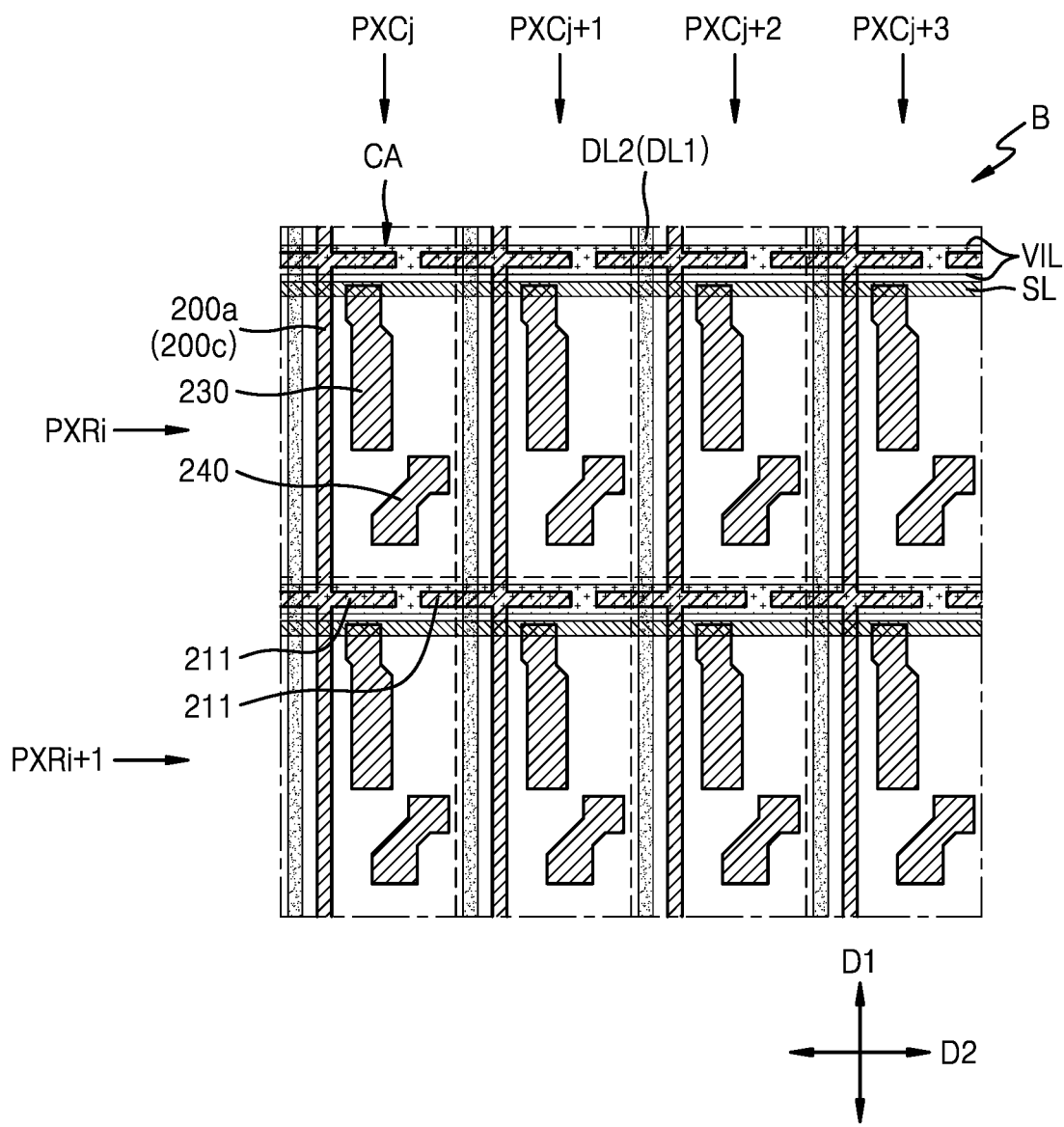
FIGS. 5 to 7 are plan views schematically illustrating examples of a first line according to an embodiment.
Figure 6:
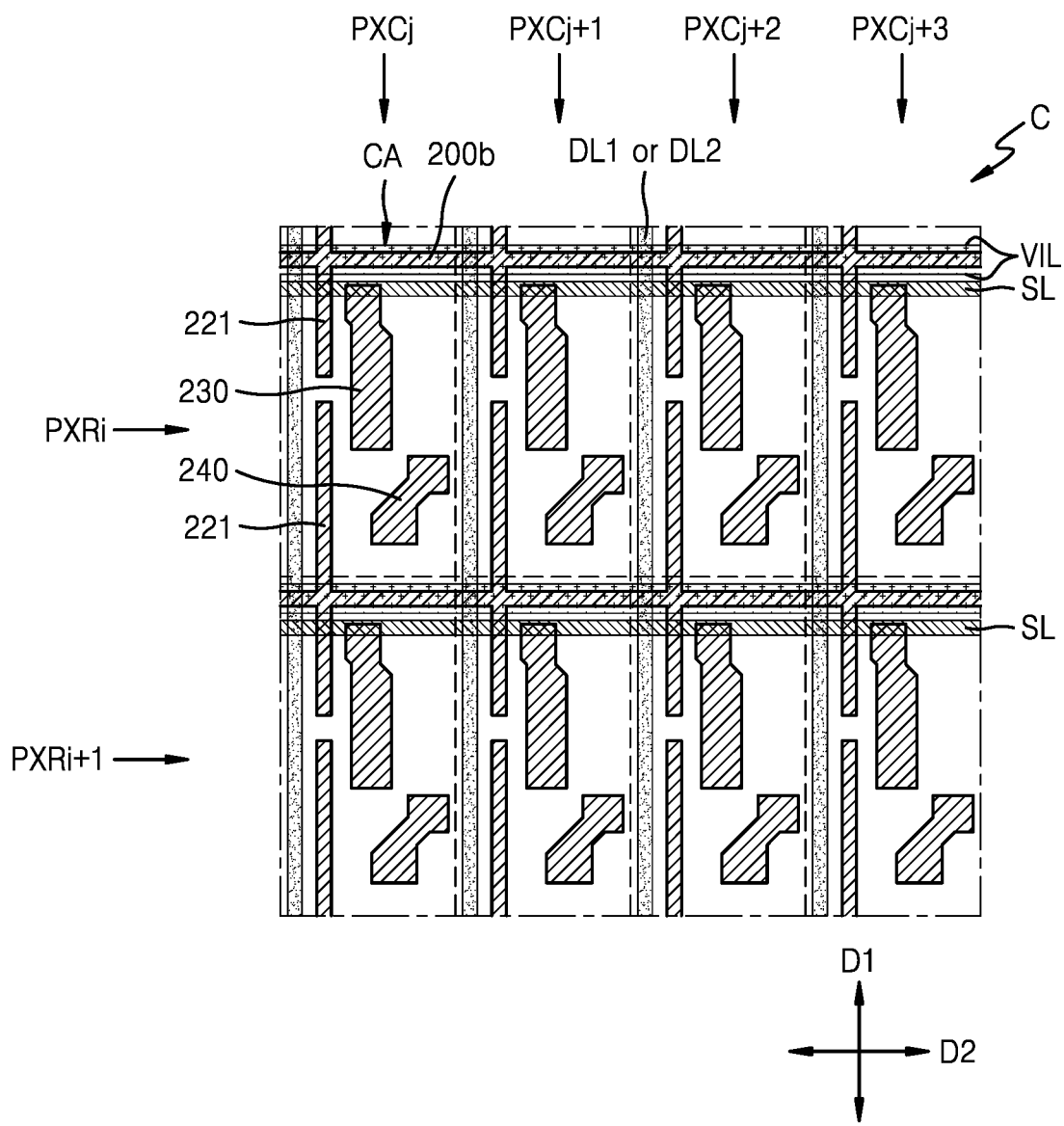
Figure 7:
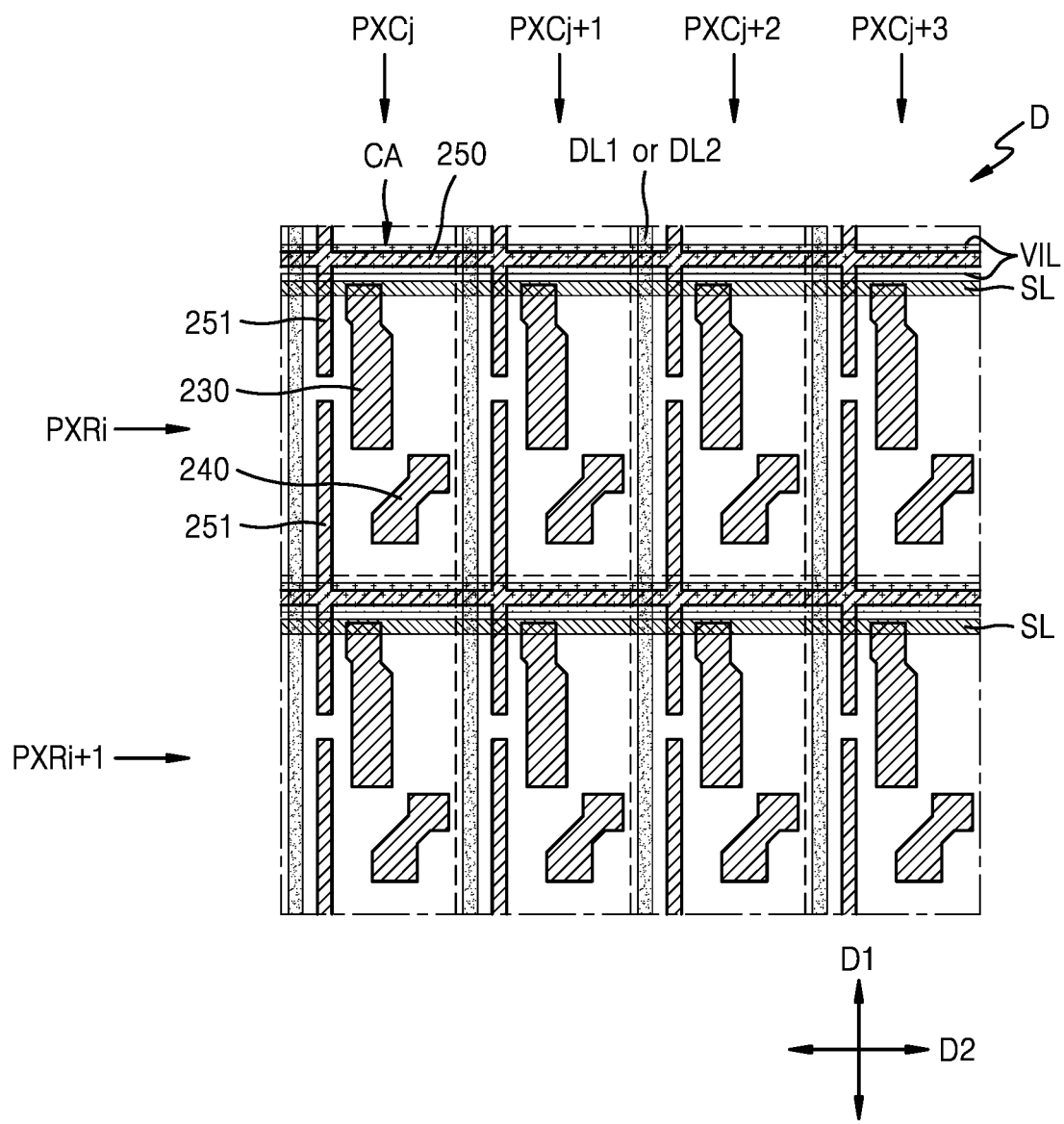

FIGS. 5 to 7 are plan views schematically illustrating an example of the first lines 200 according to an embodiment. FIG. 5 is a partial enlarged plan view of a portion B of FIG. 1, FIG. 6 is a partial enlarged plan view of a portion C of FIG. 1, and FIG. 7 is a partial enlarged plan view of a portion D of FIG. 3.

FIGS. 5 and 6 illustrate an example of portions of the first lines 200 arranged located or disposed on the right side of the center line CL. However, the embodiment is not limited thereto and this may be equally applied to portions of the first lines 200 arranged located or disposed on the left side of the center line CL. In FIGS. 5 to 7, a pixel area CA in which pixels may be arranged located or disposed may be divided by dashed lines. FIGS. 5 to 7 illustrate first lines 200 and second lines 250 arranged located or disposed in pixel areas CA of first to fourth columns PXCj, PXCj+1, PXCj+2, and PXCj+3 that may be adjacent to each other, and first and second rows PXRi and PXRi+1 that may be adjacent to each other.

FIG. 5 illustrates the first portions 200a of the first lines 200 arranged located or disposed in the first sub-area SS1. However, the embodiment is not limited thereto and this may be equally applied to the third portions 200c of the first lines 200 arranged located or disposed in the third sub-area SS3.

Referring to FIG. 5, in the first sub-area SS1, the first portions 200a of the first lines 200 may extend in a direction parallel to the first direction D1, and the first portions 200a may include first branches or segments 211 protruding in the second direction D2.

The first branches 211 may protrude from the first portion 200a, with the first portion 200a of the first line 200 as a center. For example, the first branches 211 may protrude from the first portion 200a of the first line 200 extending in the first direction D1 toward at least one side of both sides along the second direction D2. A pair of first branches 211 protruding toward each other from two adjacent first portions 200a among the first portions 200a arranged located or disposed in parallel to each other in the first sub-area SS1 may be arranged located or disposed on the same line. In order to prevent a short circuit between the first lines 200, end portions of the first branches 211 extending toward each other from two adjacent first portions 200a may be spaced apart from each other to form a gap. In the first sub-area SS1, the first portions 200a and the first branches 211 may be arranged located or disposed in the pixel areas CA in a predetermined pattern.

The third portions 200c of the first lines 200 in the third sub-area SS3 may also extend in a direction parallel to the first direction D1, and the third portions 200c may include the first branches 211 protruding in the second direction D2.

The first portion 200a may extend in parallel to the second data line DL2, and the third portion 200c may extend in parallel to the first data line DL1. The first branches 211 may extend in parallel to the scan line SL. The first branches 211 may overlap the initialization voltage line VIL. A width of the initialization voltage line VIL may be greater than a width of the first branches 211. The initialization voltage line VIL may have a width covering, or completely covering, the width of the first branches 211. The initialization voltage line VIL may be arranged located or disposed on a layer different from those of the scan line SL and the first branches 211. For example, the initialization voltage line VIL may be arranged located or disposed on a layer between the scan line SL and the first branches 211.

Referring to FIG. 6, in the second sub-area SS2, the second portions 200b of the first lines 200 may extend in a direction parallel to the second direction D2, and the second portions 200b may include second branches or segments 221 protruding in the first direction D1.

The second branches 221 may protrude from the second portion 200b, with the second portion 200b of the first line 200 as a center. For example, the second branches 221 may protrude from the second portion 200b of the first line 200 extending in the second direction D2 toward at least one side of both sides along the first direction D1. A pair of second branches 221 protruding toward each other from two adjacent second portions 200b in the second sub-area SS2 may be arranged located or disposed on the same line. In order to prevent a short circuit between the first lines 200, end portions of the second branches 221 extending toward each other from two adjacent second portions 200b may be spaced apart from each other to form a gap. In the second sub-area SS2, the first portions 200b and the second branches 221 may be arranged located or disposed in the pixel areas CA in a predetermined pattern.

The second portion 200b of the first line 200 may extend in parallel to the scan line SL, and the second branches 221 may extend in parallel to the first data line DL1 or the second data line DL2. The second portion 200b may overlap the initialization voltage line VIL. A width of the initialization voltage line VIL may be greater than a width of the second portion 200b. The initialization voltage line VIL may have a width covering, or completely covering, the width of the second portion 200b. The initialization voltage line VIL may be arranged located or disposed on a layer different from those of the scan line SL and the second portion 200b. For example, the initialization voltage line VIL may be arranged located or disposed on a layer between the scan line SL and the second portion 200b.

The first line 200 may be electrically connected to the first data line DL1 and may transmit the data signal from the pads of the pad area PADA to the first data line DL1. Since the second portion 200b of the first line 200 may be arranged located or disposed in parallel to the scan line SL, the data signal transferred to the first line 200 may be distorted by the scan signal transferred to the scan line SL. Due to the distortion of the data signal, a diagonal stain may occur along a boundary between the second sub-area SS2 and the third sub-area SS3. In an embodiment, the first line 200 may overlap the initialization voltage line VIL arranged located or disposed on a layer between the first line 200 and the scan line SL and may receive a constant voltage. Accordingly, since the initialization voltage line VIL acts as a shielding line that may block signal interference between the first line 200 and the scan line SL, the occurrence of parasitic capacitance may be minimized or prevented, thereby minimizing or preventing distortion of the data signal of the first line 200. For example, since the width of the initialization voltage line VIL may be greater than the width of the portion (for example, the second portion 200b or the first branch 211) of the first line 200 overlapping the initialization voltage line VIL, the interval between the first line 200 and the scan line SL may be more widened, thereby more effectively blocking signal interference between the first line 200 and the scan line SL.

Referring to FIG. 7, the second line 250 may be arranged located or disposed in the second area S2 on the same layer as that of the first line 200. The second line 250 may include the same or similar material as that of the first line 200. The second line 250 may be spaced apart from the first lines 200 and electrically separated from the first lines 200. The second line 250 may extend in the second direction D2 and may include third branches or segments 251 protruding in the first direction D1. The third branches 251 may protrude from the second line 250, with the second line 250 as a center. For example, the third branches 251 may protrude from the second line 250 extending in the second direction D2 toward at least one side of both sides along the first direction D1. A pair of third branches 251 protruding toward each other from two adjacent second lines 250 in the second area S2 may be arranged located or disposed on the same line. In order to prevent a short circuit between the second lines 250, end portions of the third branches 251 extending toward each other from two adjacent second portions 250 may be spaced apart from each other to form a gap.

The second lines 250 may extend in parallel to the scan line SL, and the third branches 251 may extend in parallel to the first data line DL1 or the second data line DL2. The second line 250 may overlap the initialization voltage line VIL. A width of the initialization voltage line VIL may be greater than a width of the second line 250. The initialization voltage line VIL may have a width covering, or completely covering, the width of the second line 250. The initialization voltage line VIL may be arranged located or disposed on a layer different from those of the scan line SL and the second line 250. For example, the initialization voltage line VIL may be arranged located or disposed on a layer between the scan line SL and the second line 250.

An example in which patterns of the first branches 211 may be the same or similar for each pixel area CA, patterns of the second branches 221 may be the same or similar for each pixel area CA, and patterns of the third branches 251 may be the same or similar for each pixel area CA is illustrated. In one or more embodiments, the patterns of the first branches 211, the patterns of the second branches 221, and the patterns of the third branches 251 may be different for each pixel area CA. For example, the lengths of the branches or segments, the gap positions between the branches facing each other, and the like may be different for each pixel area CA.

The first branch 211 may be a portion protruding and extending from the first portion 200a or the third portion 200c of the first line 200, the second branch 221 may be a portion protruding and extending from the second portion 200b of the first line 200, and the third branch 251 may be a portion protruding and extending from the second line 250. For example, since the branch may be a part of the line, the first line 200 may refer to the first line 200 including the first branch 211 and the second branch 221, and the second line 250 may refer to the second line 250 including the third branch 251. However, embodiments are not limited thereto.

Since the second line 250 similar to the first line 200 arranged located or disposed in the first area S1 may be arranged located or disposed in the second area S2, reflection (or scattering) characteristics of light become similar. Therefore, the first area S1 and the second area S2 may not be differently recognized.

As illustrated in FIGS. 5 to 7, conductive patterns may be arranged located or disposed on the same layer as those of the first lines 200 and the second lines 250. The conductive patterns may include first patterns 230. The first pattern 230 may function as a shielding electrode that may prevent occurrence of signal interference between a circuit element arranged located or disposed on a lower layer of the first pattern 230 and a pixel electrode arranged located or disposed on an upper layer of the first pattern 230 in each pixel PX. The first pattern 230 may be electrically connected to the power supply voltage line PL, which may be electrically connected to the pixel PX, and may receive the first power supply voltage ELVDD. The conductive patterns may include second patterns 240. The second pattern 240 may function as a bridge electrode that may electrically connect a circuit element arranged located or disposed on a lower layer of the second pattern 240 to a pixel electrode arranged located or disposed on an upper layer of the second pattern 240 in each pixel PX.

Since the first patterns 230 and the second patterns 240 may be provided in the first area S1 and the second area S2, the first area S1 and the second area S2 may not be differently recognized and the pattern density may be secured, thereby providing advantages in manufacturing.

Figure 8:
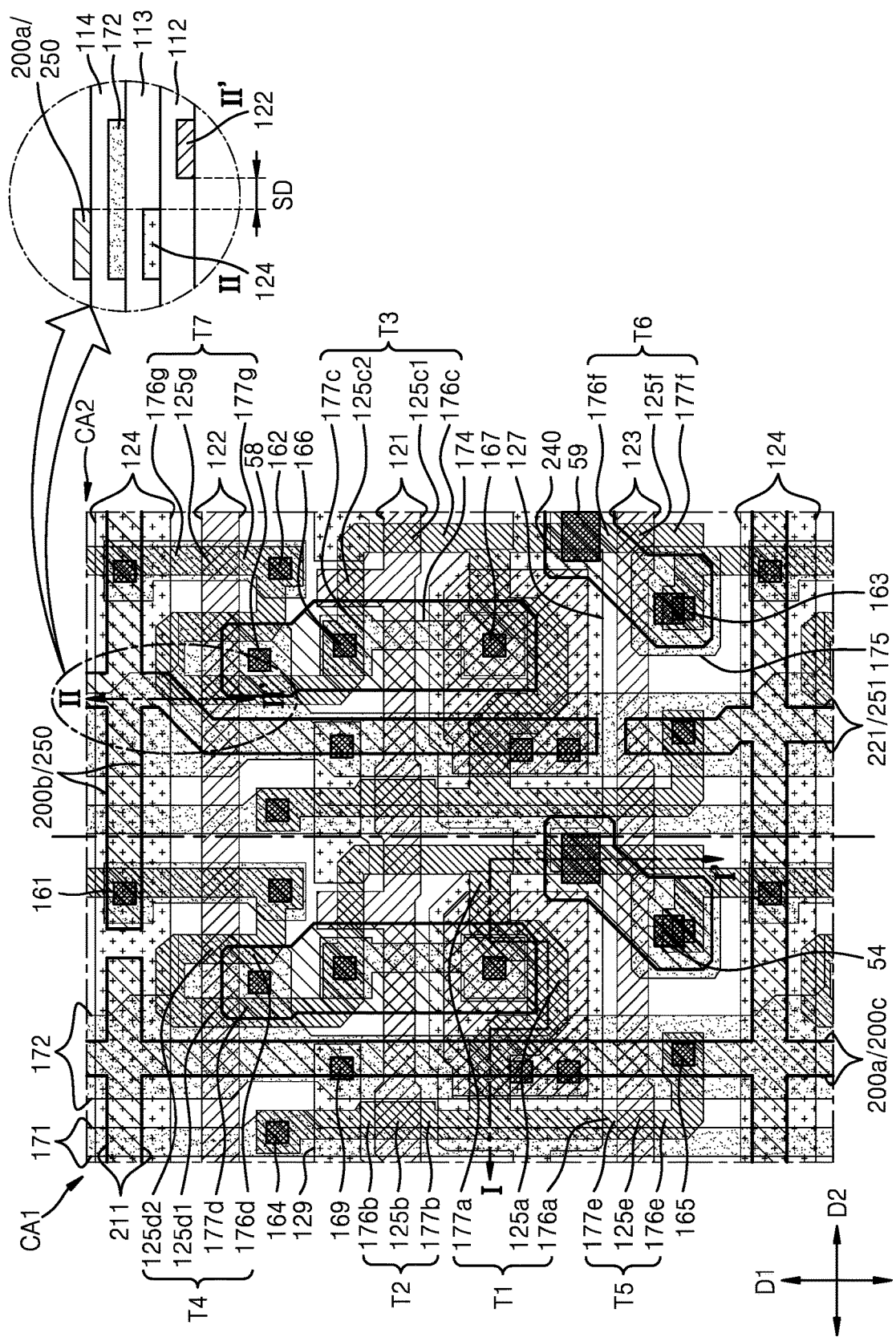
FIG. 8 is a layout diagram schematically illustrating electrodes and lines, according to an embodiment.
Figure 9:
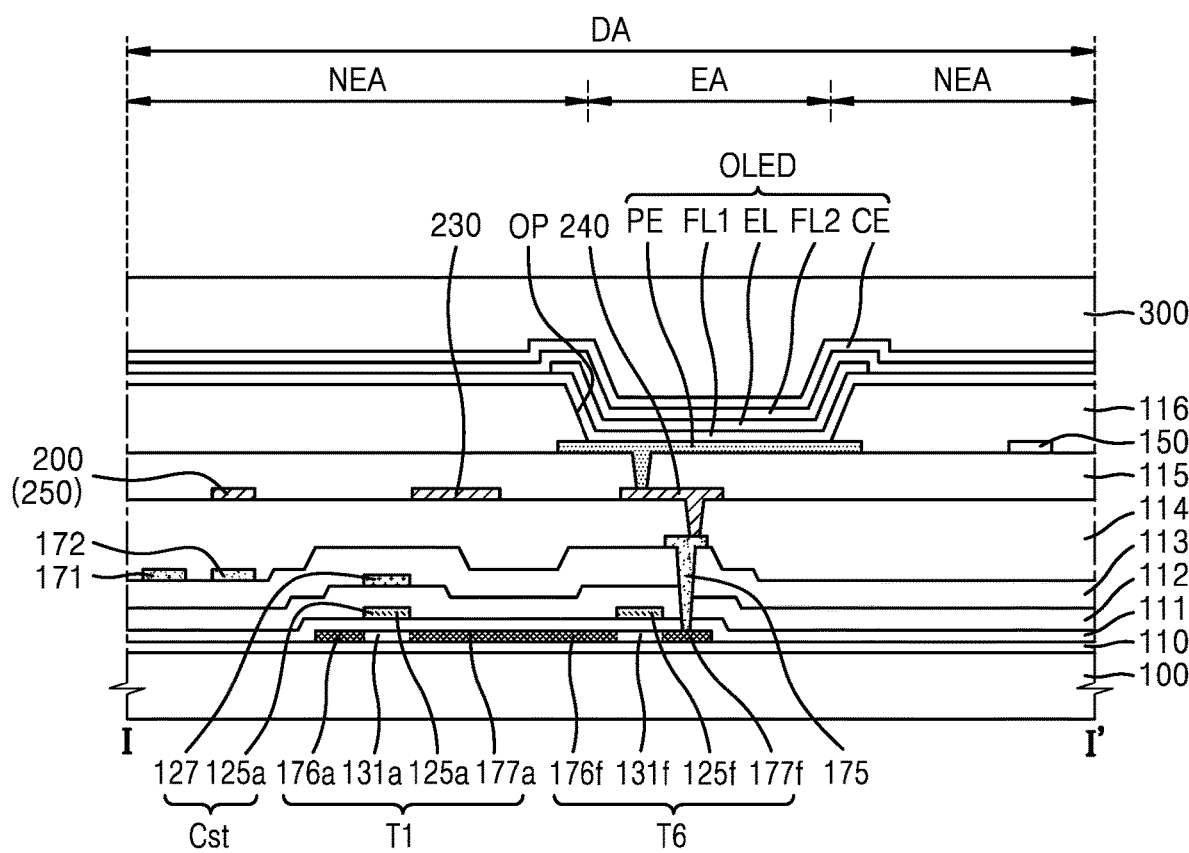
FIG. 9 is a schematic cross-sectional view of the display panel taken along line I-I' of FIG. 8.
Figure 10A:
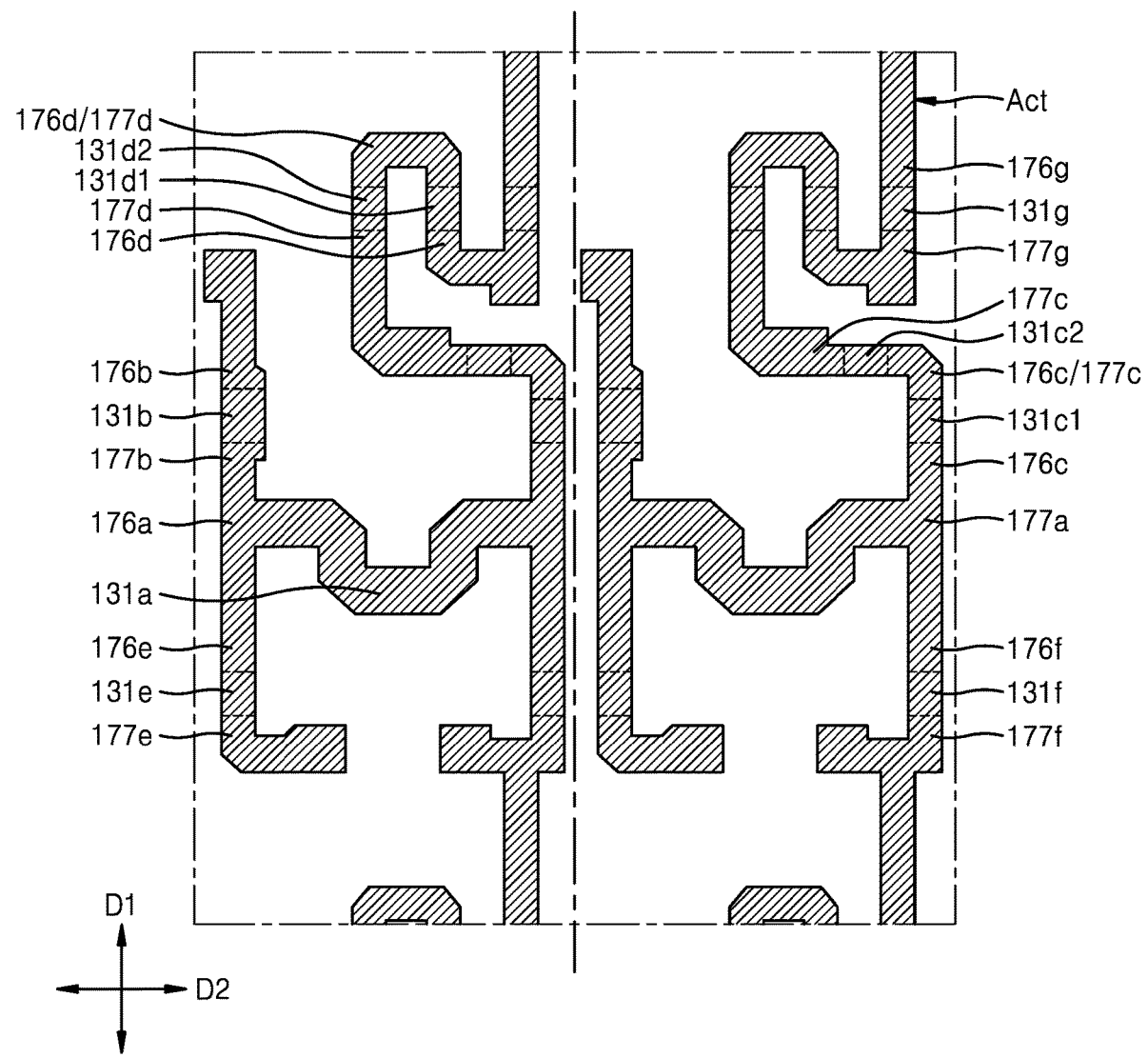
FIGS. 10A to 10E are layout diagrams schematically illustrating elements of FIG. 8 on a layer basis.

FIG. 8 is a layout diagram schematically illustrating electrodes and lines according to an embodiment. FIG. 9 is a schematic cross-sectional view of the display panel 10 taken along line I-I' of FIG. 8. FIGS. 10A to 10E are layout diagrams schematically illustrating elements of FIG. 8 on a layer basis. FIG. 11 is a plan view schematically illustrating the pixel electrode PE and the shielding member 150.

A first pixel area CA1 in which the first portion 200a or the third portion 200c of the first line 200 may be arranged located or disposed is illustrated on the left side of FIG. 8, and a second pixel area CA2 in which the second portion 200b of the first line 200 or the second line 250 may be arranged located or disposed is illustrated on the right side of FIG. 8. FIG. 9 illustrates a stacking relationship between elements included in the pixel arranged, located or disposed in the display area DA of the substrate 100 and lines connected to the pixel PX. FIG. 9 illustrates a schematic cross section of portions corresponding to the first transistor T1, the sixth transistor T6, the capacitor Cst, and the organic light-emitting diode OLED illustrated in FIG. 8. This will be described below with reference to FIGS. 8 to 11.

The substrate 100 may include various materials, such as a glass material, a metal material, or a plastic material. In an embodiment, the substrate 100 may be a flexible substrate. For example, the substrate 100 may include a polymer resin, such as polyethersulphone (PES), polyacrylate, polyetherimide (PEI), polyethyelene napthalate (PEN), polyethyelene terepthalate (PET), polyphenylene sulfide (PPS), polyarylate (PAR), polyimide (PI), polycarbonate (PC), or cellulose acetate propionate (CAP). The substrate 100 may have a multi-layered structure including an inorganic layer (not illustrated) and a layer that includes the above-mentioned polymer resin. A buffer layer 110 may be arranged located or disposed on the substrate 100.

The buffer layer 110 may have a single layer or a multi-layered structure including an inorganic insulating material, such as silicon oxide, silicon nitride, or silicon oxynitride. A barrier layer (not illustrated) that may block penetration of outside air may be included between the substrate 100 and the buffer layer 110. In an embodiment, the buffer layer 110 may be omitted.

A semiconductor layer Act may be arranged located or disposed on the buffer layer 110. The semiconductor layer Act may include amorphous silicon, polycrystalline silicon, or an organic semiconductor material. The semiconductor layer Act may be bent in various shapes. As illustrated in FIG. 10A, the semiconductor layer Act may include a channel region 131a of the first transistor T1, a channel region 131b of the second transistor T2, channel regions 131c1 and 131c2 of the third transistor T3, channel regions 131d1 and 131d2 of the fourth transistor T4, a channel region 131e of the fifth transistor T5, a channel region 131f of the sixth transistor T6, and a channel region 131g of the seventh transistor T7. For example, the respective channel regions of the first to seventh transistors T1 to T7 may be partial regions of the semiconductor layer Act. Since the channel region 131a of the first transistor T1 may have a flexure or bend or curve, the channel region 131a of the first transistor T1 may be formed to be long with the respect to other elements. Therefore, a driving range of a gate voltage applied to a gate electrode may be widened. The channel region 131a of the first transistor T1 may have various shapes such as, for example, "ㄷ," "ㄹ," "S," "M," and "W." However, the embodiment is not limited thereto and other shapes may be included within the spirit and the scope of the disclosure. The channel region 131g of the seventh transistor T7 may be a partial region of the semiconductor layer extending from a previous row. For example, the seventh transistor T7 illustrated in FIG. 8 may be a seventh transistor T7 of a pixel arranged located or disposed in the previous row.

The semiconductor layer Act of the first to seventh transistors T1 to T7 may include a source region and a drain region on both sides of each channel region. As illustrated in FIG. 10A, the semiconductor layer Act may include a source region 176a and a drain region 177a of the first transistor T1, a source region 176b and a drain region 177b of the second transistor T2, a source region 176c and a drain region 177c of the third transistor T3, a source region 176d and a drain region 177d of the fourth transistor T4, a source region 176e and a drain region 177e of the fifth transistor T5, a source region 176f and a drain region 177f of the sixth transistor T6, and a source region 176g and a drain region 177g of the seventh transistor T7. In an embodiment, the source region and the drain region may be a source electrode and a drain electrode, respectively. For example, the source electrode and the drain electrode of the first transistor T1 may respectively correspond to the impurity-doped source region 176a and the impurity-doped drain region 177a in the vicinity of the channel region 131a in the semiconductor layer Act illustrated in FIG. 10A. In an embodiment, the positions of the source region and the drain region may be changed. A first insulating layer 111 may be arranged located or disposed above the semiconductor layer Act.

Figure 10B:
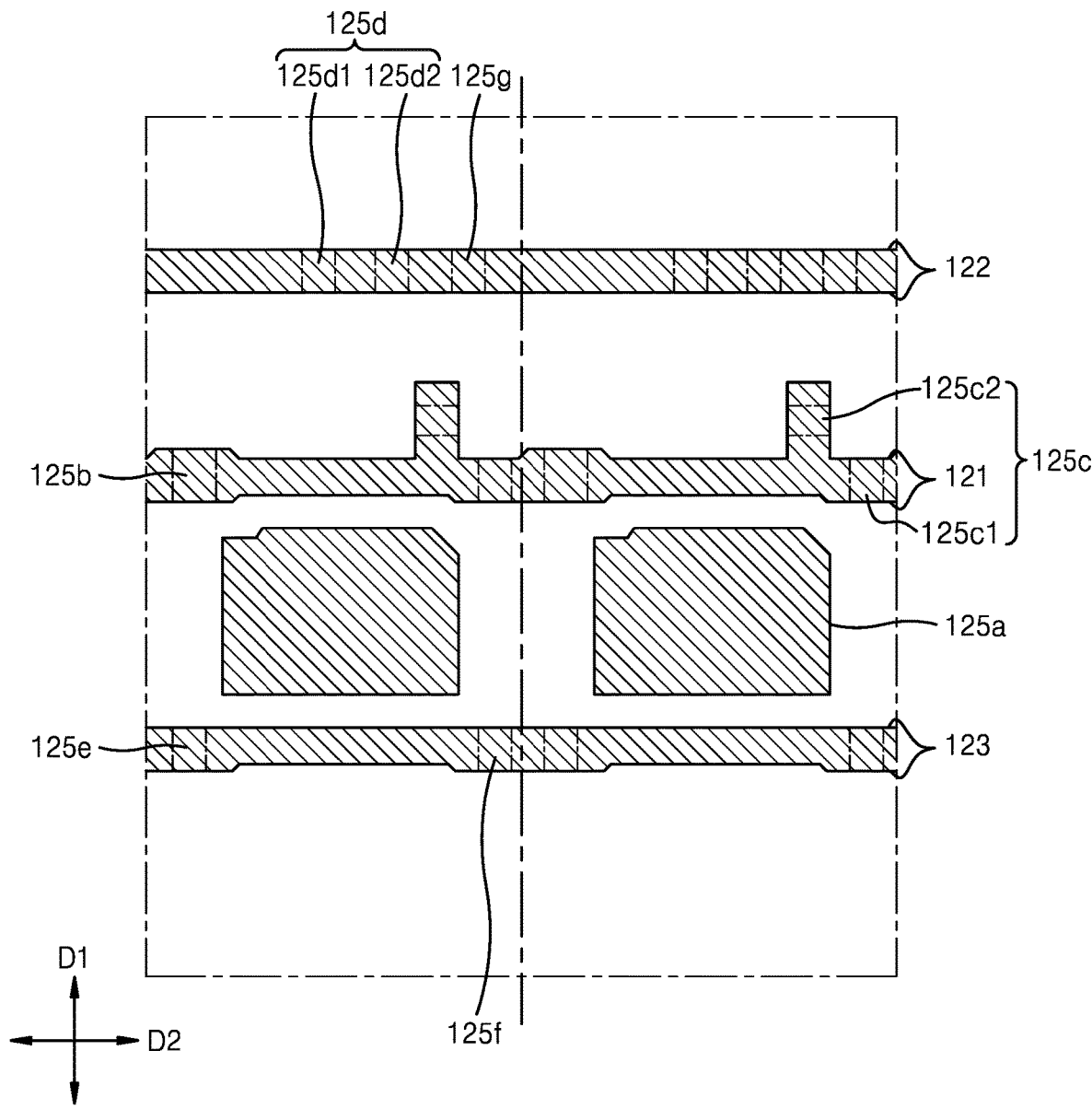
Figure 11:
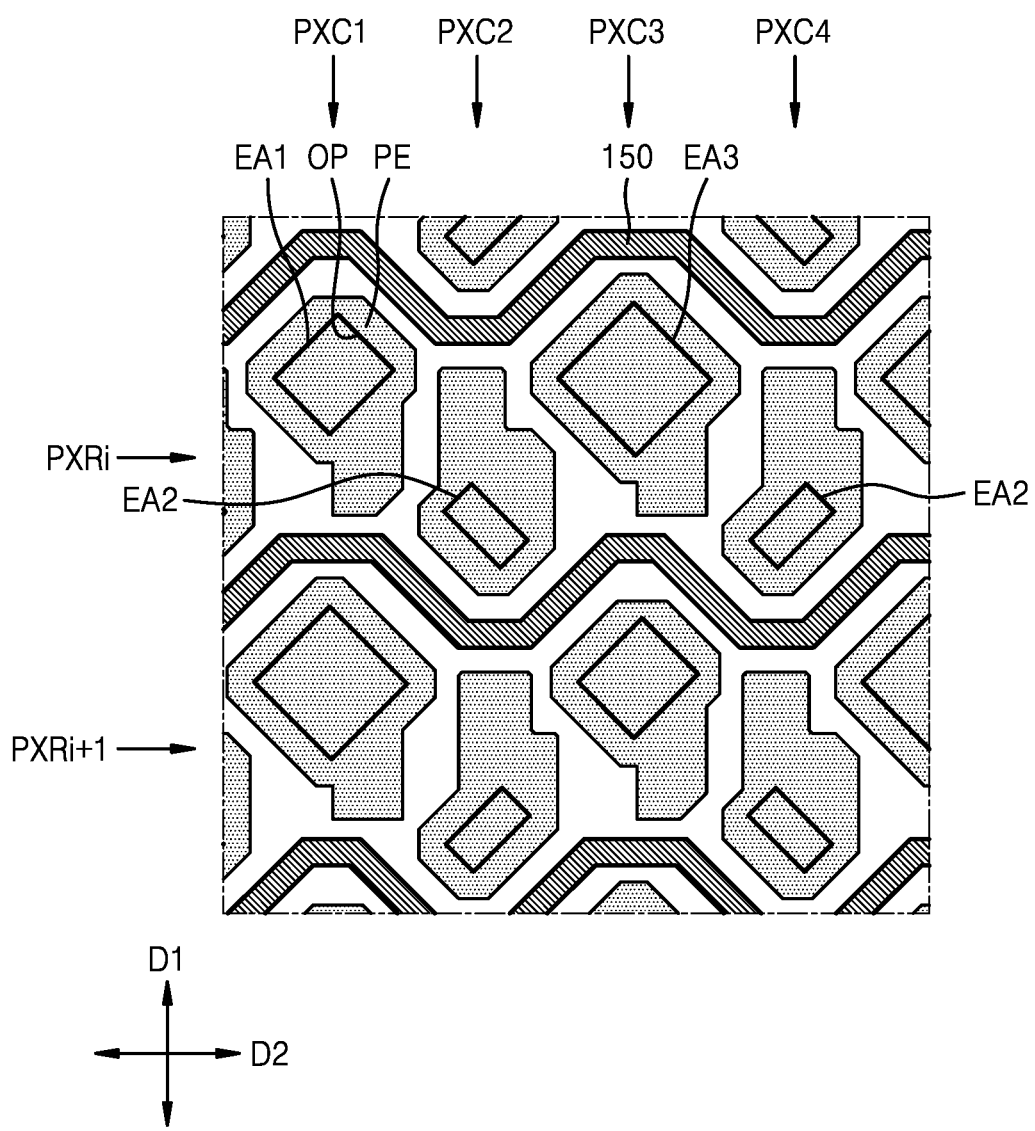
FIG. 11 is a plan view schematically illustrating a pixel electrode and a shielding member.

As illustrated in FIG. 10B, a gate electrode 125a of the first transistor T1, a gate electrode 125b of the second transistor T2, gate electrodes 125c1 and 125c2 of the third transistor T3, gate electrodes 125d1 and 125d2 of the fourth transistor T4, a gate electrode 125e of the fifth transistor T5, a gate electrode 125f of the sixth transistor T6, and a gate electrode 125g of the seventh transistor T7 may be arranged located or disposed on the first insulating layer 111. A first scan line 121, a second scan line 122, and an emission control line 123 may be arranged located or disposed on the first insulating layer 111 and extend in the second direction D2. The first scan line 121, the second scan line 122, and the emission control line 123 may be arranged located or disposed on the same layer as those of the gate electrodes of the first to seventh transistors T1 to T7 and may include the same or similar material as those of the gate electrodes of the first to seventh transistors T1 to T7. The gate electrode 125a of the first transistor T1 may also function as a lower electrode 125a of the capacitor Cst.

The gate electrode 125b of the second transistor T2 and the gate electrodes 125c1 and 125c2 of the third transistor T3 may be portions of the first scan line 121 intersecting with the semiconductor layer Act, or may be portions protruding from the first scan line 121. The gate electrodes 125d1 and 125d2 of the fourth transistor T4 and the gate electrode 125g of the seventh transistor T7 may be portions of the second scan line 122 intersecting with the semiconductor layer Act, or may be portions protruding from the second scan line 122. The gate electrode 125e of the fifth transistor T5 and the gate electrode 125f of the sixth transistor T6 may be portions of the emission control line 123 intersecting with the semiconductor layer Act, or may be portions protruding from the emission control line 123. The gate electrode 125a of the first transistor T1 may be provided as an island type.

The gate electrodes of the first to seventh transistors T1 to T7 may be a single layer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). A second insulating layer 112 may be arranged located or disposed above the gate electrodes of the first to seventh transistors T1 to T7.

Figure 10C:
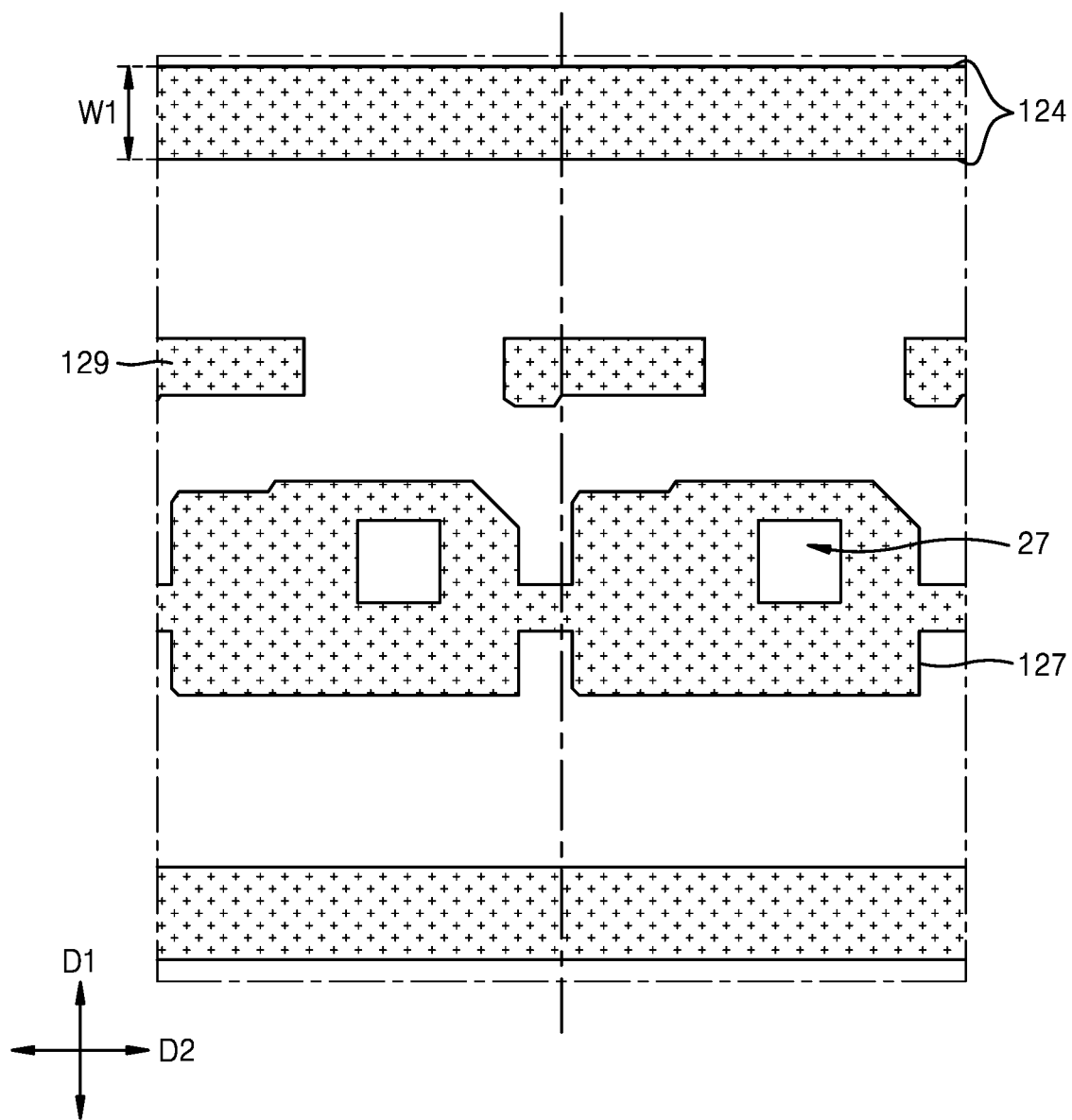
Figure 10D:
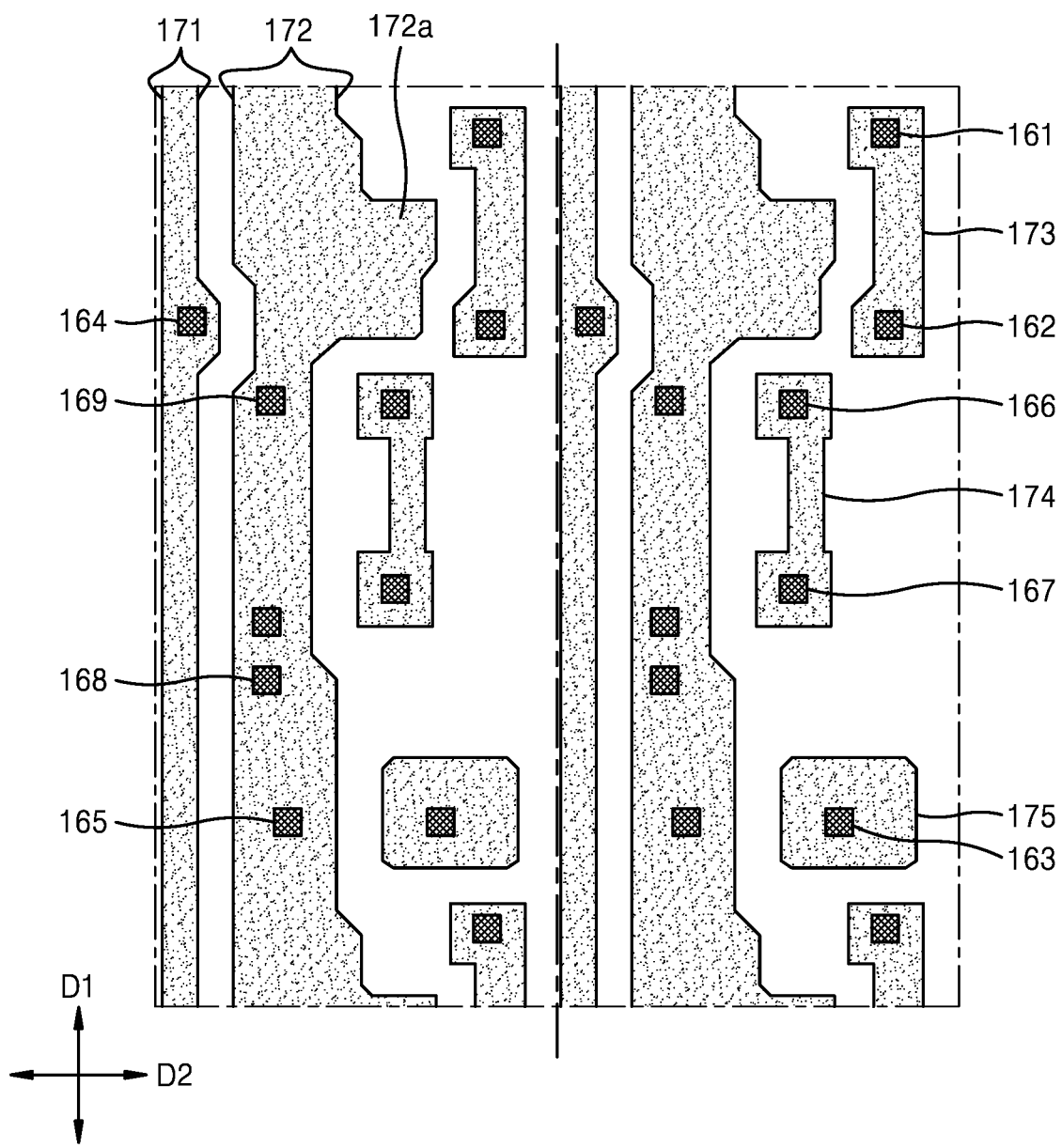

As illustrated in FIG. 10C, an upper electrode 127 of the capacitor Cst may be arranged located or disposed on the second insulating layer 112. An opening 27 may be formed in the upper electrode 127 of the capacitor Cst. A node electrode 174 (as illustrated in FIG. 10D) may electrically connect the lower electrode 125a of the capacitor Cst to the drain region 177c of the third transistor T3 through the opening 27. The upper electrode 127 of the capacitor Cst may be a single layer or a multi-layer including at least one of Al, Pt, Pd, Ag, Mg, Au, Ni, Nd, Ir, Cr, Li, Ca, Mo, Ti, W, and Cu. The capacitor Cst may share the gate electrode 125a of the first transistor T1 as the lower electrode and may overlap the first transistor T1.

An initialization voltage line 124 and a shielding electrode 129 may be arranged located or disposed on the second insulating layer 112 on the same layer as that of the upper electrode 127 of the capacitor Cst. The initialization voltage line 124 and the shielding electrode 129 may include the same or similar material as that of the upper electrode 127 of the capacitor Cst. The initialization voltage line 124 may extend in the second direction D2. The shielding electrode 129 may overlap the source region 176b of the second transistor T2 and the source region 176c and the drain region 177c of the third transistor T3. The shielding electrode 129 may overlap the source region 176c and the drain region 177c between the two channel regions 131c1 and 131c2 of the third transistor T3.

A third insulating layer 113 may be arranged located or disposed on the upper electrode 127 of the capacitor Cst, the initialization voltage line 124, and the shielding electrode 129.

The first insulating layer 111, the second insulating layer 112, and the third insulating layer 113 may be an inorganic insulating layer including an inorganic material such as silicon oxide, silicon nitride, and/or silicon oxynitride.

As illustrated in FIG. 10D, a data line 171 and a power supply voltage line 172, which extend in the first direction D1, may be arranged located or disposed on the third insulating layer 113. The data line 171 may be electrically connected to the source region 176b of the second transistor T2 through contact holes 164 formed in the first insulating layer 111, the second insulating layer 112, and the third insulating layer 113. The power supply voltage line 172 may be electrically connected to the source region 176e of the fifth transistor T5 through the contact holes 165 formed in the first insulating layer 111, the second insulating layer 112, and the third insulating layer 113. The power supply voltage line 172 may be electrically connected to the upper electrode 127 of the capacitor Cst through a contact hole 168 formed in the third insulating layer 113. The power supply voltage line 172 may be electrically connected to the shielding electrode 129 through a contact hole 169 formed in the third insulating layer 113. The power supply voltage line 172 may include a protrusion 172a protruding from the power supply voltage line 172 in the extension direction of the second scan line 122. The protrusion 172a of the power supply voltage line 172 may overlap the second scan line 122. As illustrated in a partial enlarged view of the display panel 10 taken along line II-II' of FIG. 8, since the protrusion 172a of the power supply voltage line 172 may be arranged located or disposed between the first line 200 and the second scan line 122 and may overlap the first line 200 and the second scan line 122, the protrusion 172a of the power supply voltage line 172 may prevent electrical signal interference between the second scan line 122 and the portion (the second portion 200b and the first branch 211) of the first line 200 parallel to the second scan line 122, thereby reducing parasitic capacitance between the first line 200 and the second scan line 122.

Each of the data line 171 and the power supply voltage line 172 may include Mo, Al, Cu, Ti, or the like and may be a single layer or a multi-layer. In an embodiment, each of the data line 171 and the power supply voltage line 172 may have a multi-layered structure of Ti/Al/Ti.

Various conductive layers may be arranged located or disposed on the third insulating layer 113. For example, a node electrode 174 and connection electrodes 173 and 175 may be arranged located or disposed on the third insulating layer 113. One end of the node electrode 174 may be electrically connected to the drain region 177c of the third transistor T3 and the drain region 177d of the fourth transistor T4 through contact holes 166 formed in the first insulating layer 111, the second insulating layer 112, and the third insulating layer 113, and the other end of the node electrode 174 may be electrically connected to the gate electrode 125a of the first transistor T1 through contact holes 167 formed in the second insulating layer 112 and the third insulating layer 113. For example, the other end of the node electrode 174 may be electrically connected to the gate electrode 125a of the first transistor T1 through the opening 27 formed in the upper electrode 127 of the capacitor Cst. One end of the connection electrode 173 may be electrically connected to the initialization voltage line 124 through a contact hole 161 formed in the third insulating layer 113, and the other end of the connection electrode 173 may be electrically connected to the source region 176d of the fourth transistor T4 through contact holes 162 formed in the first insulating layer 111, the second insulating layer 112, and the third insulating layer 113. The connection electrode 175 may be electrically connected to the drain region 177f of the sixth transistor T6 through contact holes 163 formed in the first insulating layer 111, the second insulating layer 112, and the third insulating layer 113.

Each of the node electrode 174 and the connection electrodes 173 and 175 may include Mo, Al, Cu, Ti, or the like and may be a single layer or a multi-layer. In an embodiment, each of the node electrode 174 and the connection electrodes 173 and 175 may have a multi-layered structure of Ti/Al/Ti.

A fourth insulating layer 114 may be arranged located or disposed on the data line 171 and the power supply voltage line 172. The first line 200 and the second line 250 may be arranged located or disposed on the fourth insulating layer 114.

Figure 10E:
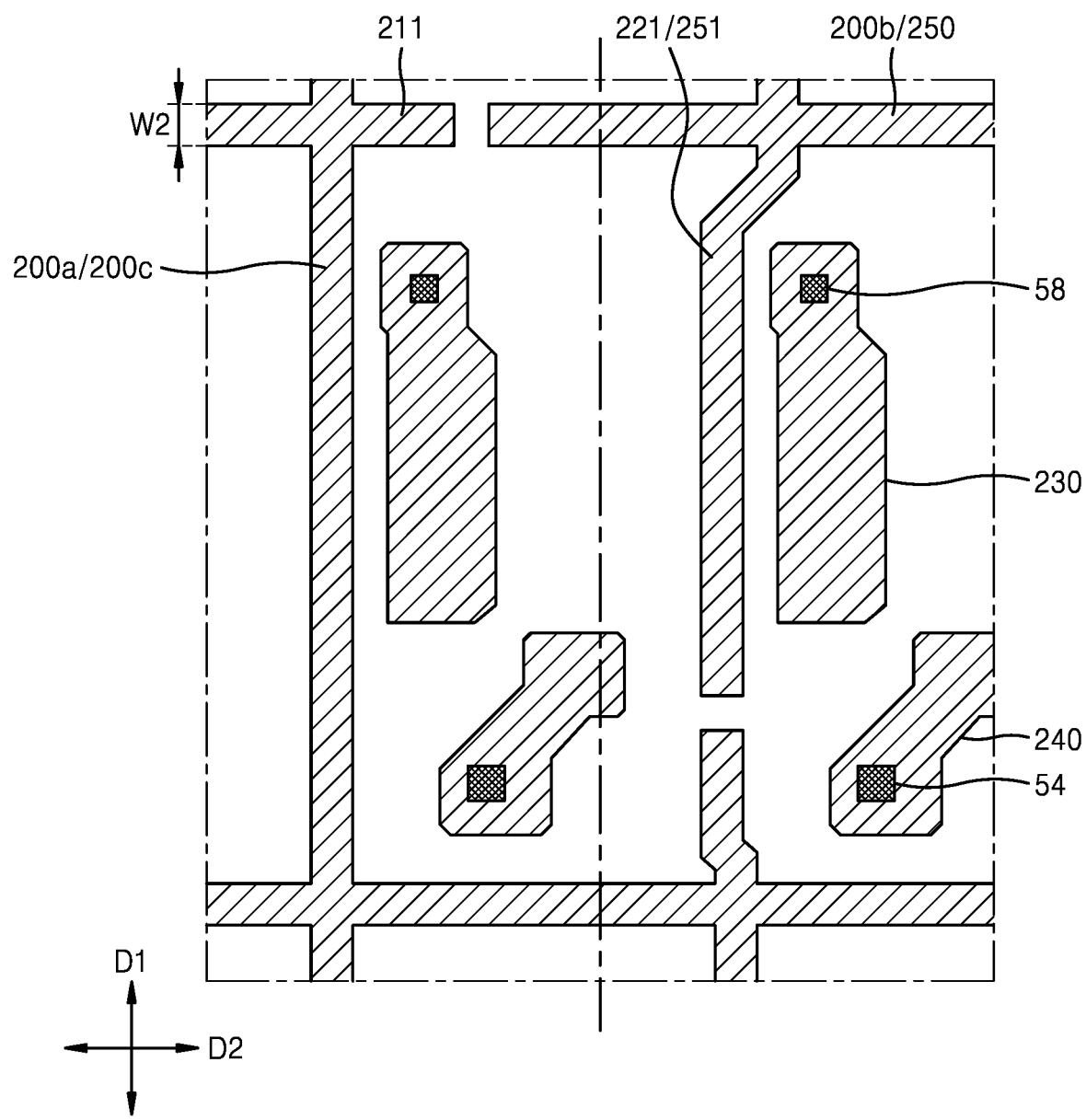

As illustrated on the left side of FIG. 10E, the first portion 200a of the first line 200, which may be parallel to the second data line DL2, and the first branch 211, which may be parallel to the second scan line 122 and may overlap the initialization voltage line 124, may be arranged located or disposed in the first pixel area CA1. Similarly, the third portion 200c of the first line 200, which may be parallel to the first data line DL1, and the first branch 211, which may be parallel to the second scan line 122 and may overlap the initialization voltage line 124, may be arranged located or disposed in the first pixel area CA1. As illustrated on the right side of FIG. 10E, the second portion 200b of the first line 200, which may be parallel to the second scan line 122 and may overlap the initialization voltage line 124, and the second branch 221, which may be parallel to the first data line DL1 or the second data line DL2, may be arranged located or disposed in the second pixel area CA2. Similarly, the second line 250, which may be parallel to the second scan line 122 and may overlap the initialization voltage line 124, and the third branch 251, which may be parallel to the first data line DL1 or the second data line DL2, may be arranged located or disposed in the third pixel area. For example, the portions (for example, the second portion 200b and the first branch 211) of the first line 200 extending in the second direction D2 and the second line 250 may overlap the initialization voltage line 124.

As illustrated in the partial enlarged view of the display panel 10 taken along line II-II' of FIG. 8, the initialization voltage line 124 may be arranged located or disposed on a layer between the first line 200 and the second scan line 122 and a layer between the second line 250 and the second scan line 122. The initialization voltage line 124 may block electrical signal interference between the first line 200 and the second scan line 122, thereby reducing parasitic capacitance between the first line 200 and the second scan line 122. A width W1 (FIG. 10C) of the initialization voltage line 124 may be greater than a width W2 of the first line 200 and the second line 250 overlapping the initialization voltage line 124. The second scan line 122 and the initialization voltage line 124 should be spaced apart from each other. Therefore, when the width W1 of the initialization voltage line 124 is greater than the width W2 of the first line 200, a separation distance SD between the first line 200 and the second scan line 122 may be increased, thereby enhancing an effect of blocking electrical signal interference between the first line 200 and the second scan line 122.

Each of the first line 200 and the second line 250 may be a single layer or a multi-layer including at least one of Mo, Al, Cu, Ti, and any alloy thereof. In an embodiment, each of the first line 200 and the second line 250 may have a multi-layered structure of Ti/Al/Ti. The first line 200 and the second line 250 may overlap at least part of the power supply voltage line 172. A first pattern 230 and a second pattern 240 may be arranged located or disposed on the fourth insulating layer 114. The first pattern 230 and the second pattern 240 may include the same or similar materials as those of the first line 200 and the second line 250. The first pattern 230 may be electrically connected to the power supply voltage line 172 through a contact hole 58 of the fourth insulating layer 114. The second pattern 240 may be electrically connected to the connection electrode 175 through a contact hole 54 of the fourth insulating layer 114. The second pattern 240 may be electrically connected to the pixel electrode PE arranged located or disposed on an upper layer through a contact hole 59 (FIG. 8) of the fifth insulating layer 115. For example, the sixth transistor T6 and the pixel electrode PE may be electrically connected to each other by the connection electrode 175 and the second pattern 240.

The fifth insulating layer 115 may be arranged located or disposed on the first line 200, the second line 250, the first pattern 230, and the second pattern 240.

Each of the fourth insulating layer 114 and the fifth insulating layer 115 may be an organic insulating layer as a planarization insulating layer. Each of the fourth insulating layer 114 and the fifth insulating layer 115 may include an organic insulating material, for example, a general-purpose polymer such as polymethylmethacrylate (PMMA) or polystylene (PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, and any blend thereof. In an embodiment, each of the fourth insulating layer 114 and the fifth insulating layer 115 may include polyimide.

Although omitted in FIG. 8, as illustrated in FIG. 9, an organic light-emitting diode OLED serving as a display element may be arranged located or disposed above the fifth insulating layer 115. The organic light-emitting diode OLED may include a pixel electrode PE, an emission layer EL, and a counter electrode CE.

The pixel electrode PE may be arranged located or disposed on the fifth insulating layer 115 and may include conductive oxides such as indium tin oxide (ITO), indium zinc oxide (IZO), zinc oxide (ZnO), indium oxide ($In_2O_3$), indium gallium oxide (IGO), or aluminium zinc oxide (AZO). In an embodiment, the pixel electrode PE may include a reflective film including Ag, Mg, Al, Pt, Pd, Au, Ni, Nd, Ir, Cr, or any compound thereof. In an embodiment, the pixel electrode PE may include a layer including ITO, IZO, ZnO, or $In_2O_3$ above and/or below the above-described reflective film. The pixel electrode PE may be electrically connected to the sixth transistor T6 through the second pattern 240 on the fourth insulating layer 114.

A shielding member 150 may be arranged located or disposed on the fifth insulating layer 115. As illustrated in FIG. 11, the shielding member 150 may extend in the second direction D2 along a part of the edge of the pixel electrode PE, so as not to overlap the pixel electrode PE when seen in a plan view, and may be arranged located or disposed above and/or below each row. The shielding member 150 may extend linearly or in zigzag along the second direction D2 according to an arrangement of the pixel electrodes PE of the same row. FIG. 11 illustrates the shielding members 150 arranged located or disposed around pixel electrodes PE of first to third pixels arranged located or disposed at first to fourth columns PXC1, PXC2, PXC3, and PXC4 of an arbitrary row PXRi. The shielding member 150 may be arranged located or disposed in a non-emission area NEA (FIG. 9).

The shielding members 150 may include a light-blocking metal. For example, the shielding members 150 may include Mo, Al, Cu, Ti, or the like and may be a single layer or a multi-layer including the above-mentioned material. In an embodiment, the shielding members 150 may be a multi-layer of Ti/Al/Ti. The shielding members 150 may include the same or similar material as that of the pixel electrode PE. The shielding members 150 may be spaced apart from each other and may be independently provided for each row. The shielding members 150 may be floating and may be electrically connected to a constant voltage line (for example, the power supply voltage line, the initialization voltage line, or the like) and may receive a constant voltage.

A sixth insulating layer 116 may be arranged located or disposed on the fifth insulating layer 115. Since the sixth insulating layer 116 may have an opening corresponding to each pixel, for example, an opening OP exposing a part of the pixel electrode PE, the sixth insulating layer 116 may serve as a pixel defining layer. The sixth insulating layer 116 may include an organic material, such as acryl, benzocyclobutene (BCB), polyimide, or hexamethyldisiloxane (HMDSO). The sixth insulating layer 116 may include the above-mentioned inorganic material. Hereinafter, the opening OP of the sixth insulating layer or an area of the pixel electrode PE exposed by the opening OP of the sixth insulating layer 116 may be defined as an emission area EA. An emission layer EL may be arranged located or disposed in the emission area EA. As illustrated in FIG. 11, an emission area EA1 of a first pixel, an emission area EA2 of a second pixel, and an emission area EA3 of a third pixel may have different sizes. A column at which the first emission area EA1 and the third emission area EA3 may be alternately repeated along the first direction D1 and a column at which the second emission area EA2 may be repeated may be repeated along the second direction D2. For example, the first emission area EA1, the second emission area EA2, the third emission area EA3, and the second emission area EA2 may be repeated along the second direction D2. However, the disclosure is not limited thereto.

The periphery of the emission areas EA may be a non-emission area NEA, and the non-emission area NEA may surround the emission areas EA. For example, a display area DA may include emission areas EA and a non-emission area NEA surrounding the emission areas EA, and a peripheral area PA may include a non-emission area.

The emission layer EL may be arranged located or disposed on the pixel electrode PE exposed by the opening OP of the sixth insulating layer 116. The emission layer EL may include a high-molecular-weight or low-molecular-weight organic material emitting light of a certain color. The emission layer EL may be a red light-emitting layer, a green light-emitting layer, or a blue light-emitting layer. In an embodiment, in order to emit white light, the emission layer EL may have a multi-layered structure in which a red light-emitting layer, a green light-emitting layer, and a blue light-emitting layer may be stacked, or a single-layered structure including a red light-emitting material, a green light-emitting material, and a blue light-emitting material. In an embodiment, a first functional layer FL1 below the emission layer EL and/or a second functional layer FL2 above the emission layer EL may be included. The first functional layer FL1 and/or the second functional layer FL2 may include an integrated layer throughout the plurality of the pixel electrodes PE, or may include layers patterned corresponding to the respective pixel electrodes PE.

The first functional layer FL1 may be a single layer or a multi-layer. For example, when the first functional layer FL1 may include a high-molecular-weight material, the first functional layer FL1 may be a hole transport layer (HTL) having a single-layered structure and may include poly-(3.4)-ethylene-dihydroxy thiophene (PEDOT) or polyaniline (PANI). When the first functional layer FL1 may include a low-molecular-weight material, the first functional layer FL1 may include a hole injection layer (HIL) and an HTL.

The second functional layer FL2 may not always be provided. For example, when each of the first functional layer FL1 and the emission layer EL includes a high-molecular-weight material, the second functional layer FL2 may be formed to improve characteristics of the organic light-emitting diode. The second functional layer FL2 may be a single layer or a multi-layer. The second functional layer FL2 may include an electron transport layer (ETL) and/or an electron injection layer (EIL).

The counter electrode CE may be arranged located or disposed to face the pixel electrode PE, with the emission layer EL interposed therebetween. The counter electrode CE may include a conductive material having a low work function. For example, the counter electrode CE may include a (semi)transparent layer including Ag, Mg, Al, Pt, Pd, Au, Ni, Nd, Ir, Cr, Li, Ca, or any alloy thereof. In an embodiment, the counter electrode CE may include a layer such as ITO, IZO, ZnO, or $In_2O_3$ on the (semi)transparent layer including the above-mentioned material. The counter electrode CE may be arranged located or disposed above the emission layer EL and the sixth insulating layer 116. The counter electrode CE may be a common electrode that may be integrally formed in the organic light-emitting diodes OLED in the display area DA and may face the pixel electrodes PE.

An encapsulation layer 300 may be arranged located or disposed above the organic light-emitting diode OLED. The encapsulation layer 300 may include at least one inorganic encapsulation layer including an inorganic material and at least one organic encapsulation layer including an organic material. The organic encapsulation layer may be thicker than the inorganic encapsulation layer. In an embodiment, the encapsulation layer 300 may have a structure in which a first inorganic encapsulation layer, an organic encapsulation layer, and a second inorganic encapsulation layer may be stacked. An inorganic material of the first inorganic encapsulation layer may be identical to or different from an inorganic material of the second inorganic encapsulation layer. The first inorganic encapsulation layer may have a double-layer structure including different inorganic materials. A capping layer covering the counter electrode CE may be arranged located or disposed between the counter electrode CE of the organic light-emitting diode OLED and the encapsulation layer 300. In one or more embodiments, a sealing substrate (not illustrated) may be arranged located or disposed above the organic light-emitting diode OLED to face the substrate 100, and may be bonded to the substrate 100 at the outside of the display area DA by a sealing member such as a sealant or a frit.

Figure 12:
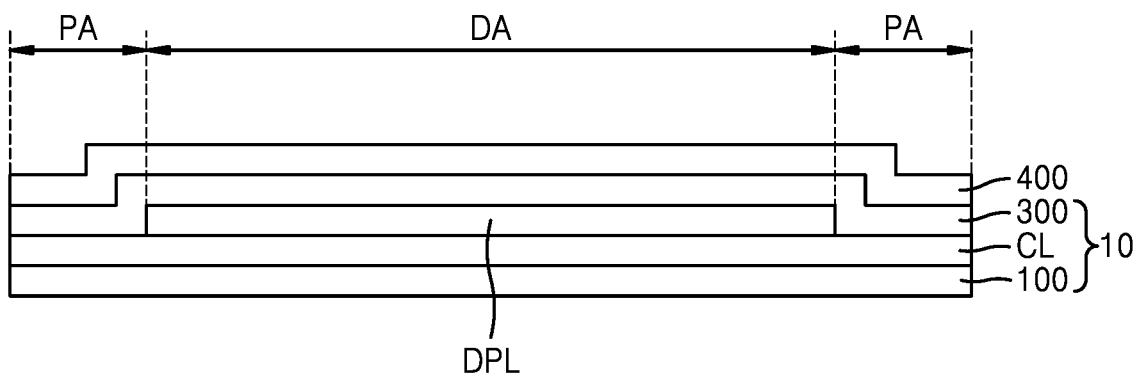
FIG. 12 is a schematic cross-sectional view of a display apparatus according to an embodiment.
Figure 13:
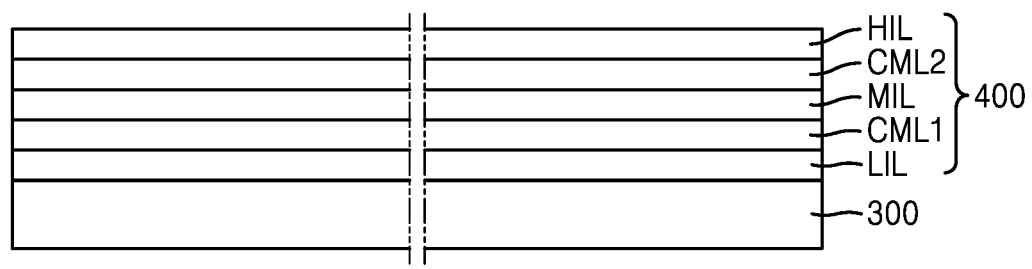
FIGS. 13 and 14 are respectively a schematic cross-sectional view and a plan view schematically illustrating an input sensing layer on a display panel, according to an embodiment.
Figure 14:
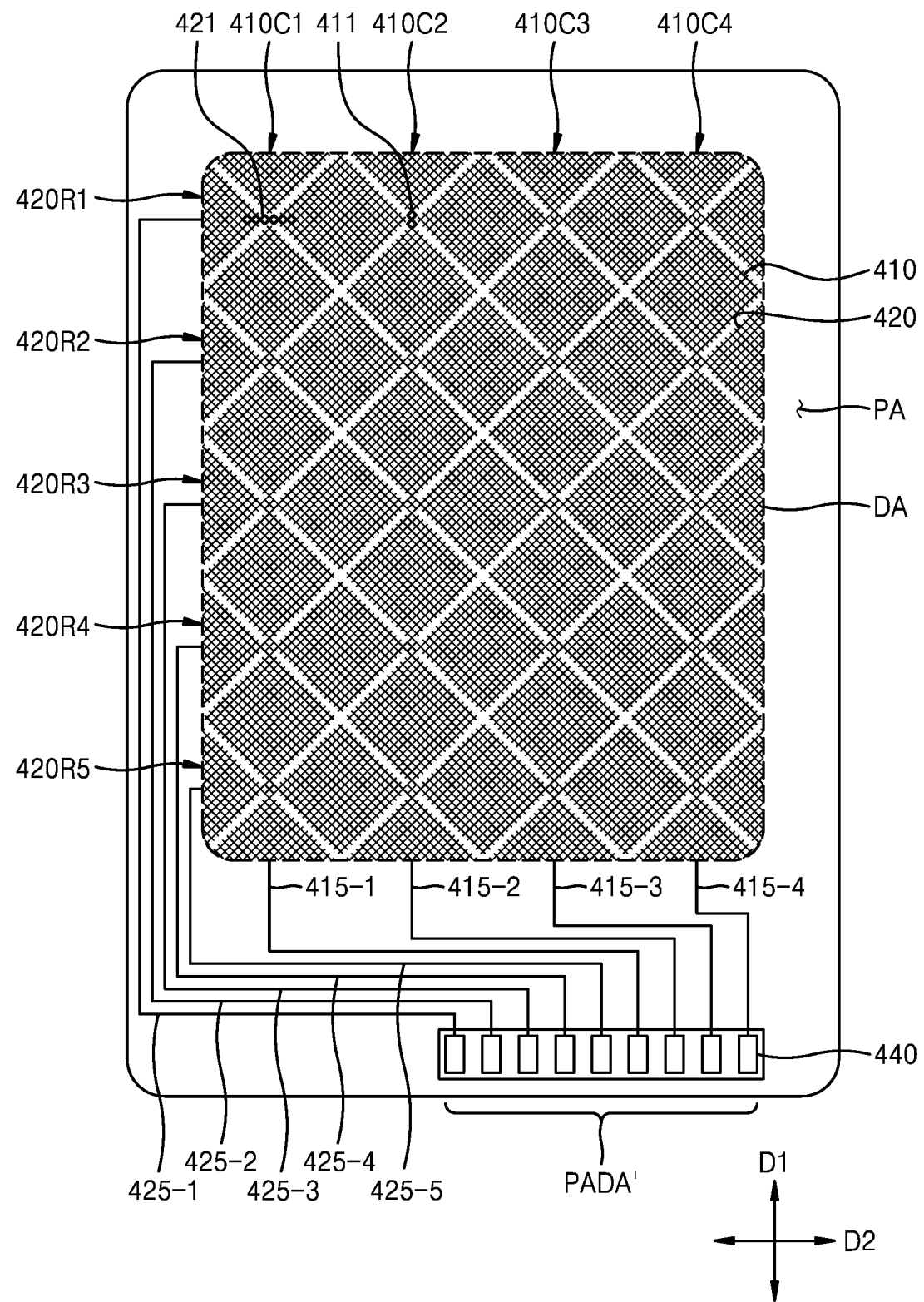

FIG. 12 is a schematic cross-sectional view of a display apparatus according to an embodiment. FIGS. 13 and 14 are respectively a schematic cross-sectional view and a plan view schematically illustrating an input sensing layer on a display panel, according to an embodiment. FIGS. 15A to 15D are plan views of input sensing layers on a layer basis. FIG. 15E is a plan view illustrating the layout of a shielding member and an input sensing layer.

Referring to FIG. 12, the display apparatus according to the embodiment may include a substrate 100, and a circuit layer CL, a display layer DPL, an encapsulation layer 300, and an input sensing layer 400, which may be arranged located or disposed above the substrate 100. The display panel 10 may include the substrate 100, the circuit layer CL, the display layer DPL, and the encapsulation layer 300.

The circuit layer CL may include insulating layers, conductive layers, and a semiconductor layer. The conductive layers may constitute signal lines and/or a pixel circuit PC of a pixel PX. The display layer DPL may include organic light-emitting diodes OLED of pixels PX. The encapsulation layer 300 may cover the display area DA and may extend to the outside of the display area DA.

The input sensing layer 400 may be arranged located or disposed on the encapsulation layer 300. As illustrated in FIG. 13, the input sensing layer 400 may include a first conductive layer CML1 and a second conductive layer CML2 arranged located or disposed on the encapsulation layer 300. A lower insulating layer LIL may be arranged located or disposed between the first conductive layer CML1 and the encapsulation layer 300, a middle insulating layer MIL may be arranged located or disposed between the first conductive layer CML1 and the second conductive layer CML2, and an upper insulating layer HIL may be arranged located or disposed on the second conductive layer CML2.

Each of the first conductive layer CML1 and the second conductive layer CML2 may include a metal. For example, each of the first conductive layer CML1 and the second conductive layer CML2 may include Mo, Al, Cu, Ti, or the like and may be a single layer or a multi-layer including the above-mentioned materials. In an embodiment, each of the first conductive layer CML1 and the second conductive layer CML2 may have a multi-layered structure of Ti/Al/Ti.

In an embodiment, each of the lower insulating layer LIL and the middle insulating layer MIL may be an inorganic insulating layer such as silicon nitride, and the upper insulating layer HIL may be an organic insulating layer. FIG. 13 illustrates that the lower insulating layer LIL may be arranged located or disposed between the encapsulation layer 300 and the first conductive layer CML1. However, in one or more embodiments, the lower insulating layer LIL may be omitted, and the first conductive layer CML1 may be arranged located or disposed directly on the encapsulation layer 300 of the display panel 10. In one or more embodiments, each of the lower insulating layer LIL and the middle insulating layer MIL may be an organic insulating layer.

Referring to FIG. 14, the input sensing layer 400 may have a shape corresponding to the display panel 10. The input sensing layer 400 may have a display area DA and a peripheral area PA respectively corresponding to the display area DA and the peripheral area PA of the display panel 10. The input sensing layer 400 may include first sensing electrodes 410, first signal lines 415-1 to 415-4 connected to the first sensing electrodes 410, second sensing electrodes 420, and second signal lines 425-1 to 425-5 connected to the second sensing electrodes 420. The input sensing layer 400 may sense an external input by a mutual cap method and/or a self cap method.

The first sensing electrodes 410 may be arranged located or disposed in the first direction D1, and the second sensing electrodes 420 may be arranged located or disposed in the second direction D2. The first sensing electrodes 410 arranged located or disposed in the first direction D1 may be electrically connected to each other by a first connection electrode 411 between the first sensing electrodes 410 adjacent to each other and may form first sensing lines 410C1 to 410C4. The second sensing electrodes 420 arranged located or disposed in the second direction D2 may be electrically connected to each other by a second connection electrode 421 between the second sensing electrodes 420 adjacent to each other and may form second sensing lines 420R1 to 420R5. The first sensing lines 410C1 to 410C4 and the second sensing lines 420R1 to 420R5 may intersect with each other. For example, the first sensing lines 410C1 to 410C4 and the second sensing lines 420R1 to 420R5 may be perpendicular to each other.

The first sensing lines 410C1 to 410C4 and the second sensing lines 420R1 to 420R5 may be arranged located or disposed on the display area DA and may be electrically connected to a sensing signal pad 440 through the first signal lines 415-1 to 415-4 and the second signal lines 425-1 to 425-5 formed in the peripheral area PA. The first sensing lines 410C1 to 410C4 may be electrically connected to the first signal lines 415-1 to 415-4, and the second sensing lines 420R1 to 420R5 may be electrically connected to the second signal lines 425-1 to 425-5. FIG. 14 exemplarily illustrates four first sensing lines 410C1 to 410C4 and five second sensing lines 420R1 to 420R5.

Figure 15A:
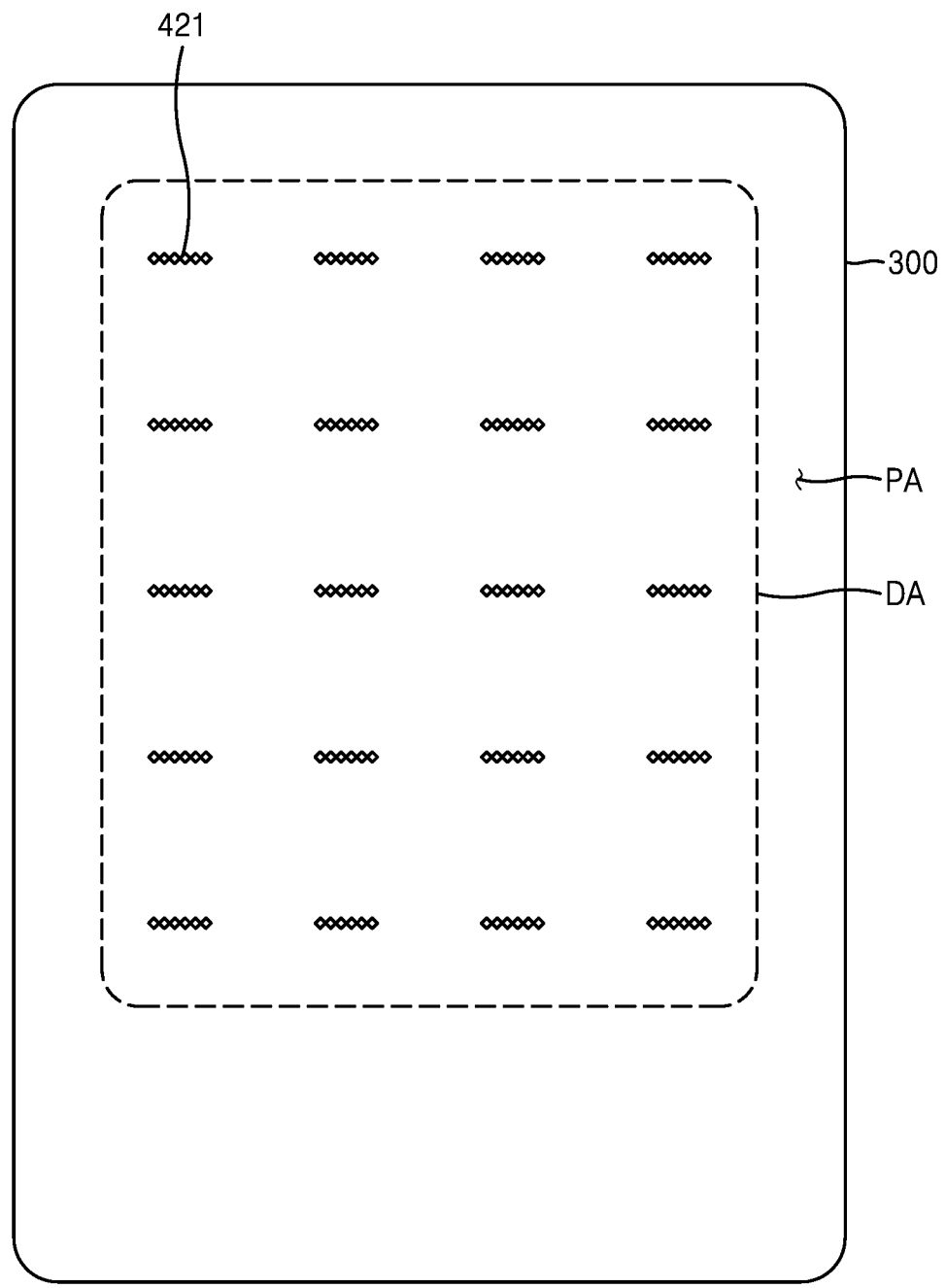
Figure 15C:
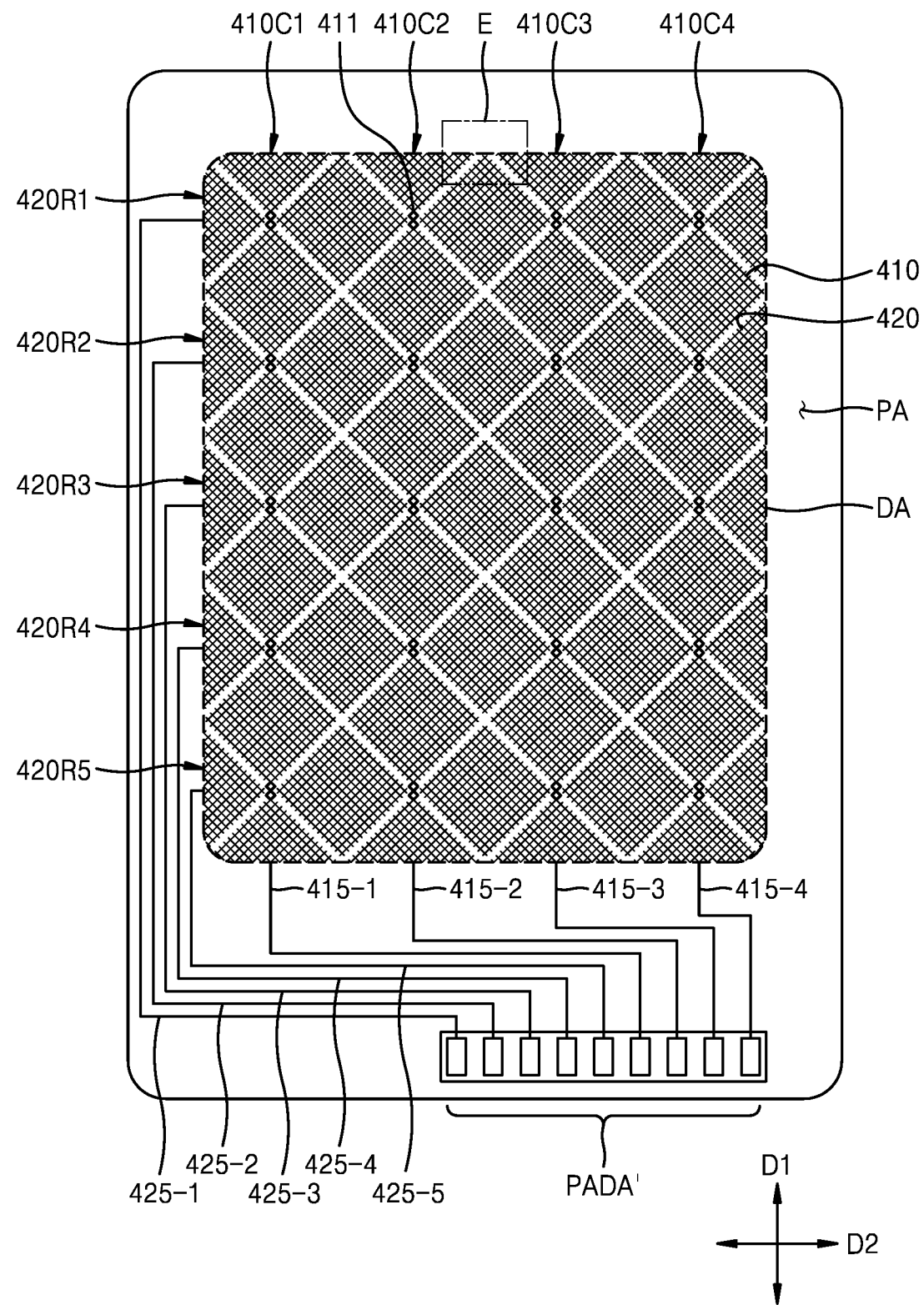

As illustrated in FIG. 15A, the first conductive layer CML1 may include second connection electrodes 421. As illustrated in FIG. 15C, the second conductive layer CML2 may include first sensing electrodes 410, first connection electrodes 411, and second sensing electrodes 420. The first sensing electrodes 410 may be electrically connected to each other by the first connection electrodes 411 formed on the same layer as those of the first sensing electrodes 410. The second sensing electrodes 420 may be electrically connected to each other by the second connection electrodes 421 formed on different layers as those of the second sensing electrodes 420. As illustrated in FIGS. 13 and 15B, the second connection electrode 421 electrically connecting the second sensing electrodes 420 adjacent to each other may be electrically connected to the second sensing electrodes 420 adjacent to each other through a contact hole CH formed in the middle insulating layer MIL.

Figure 15D:
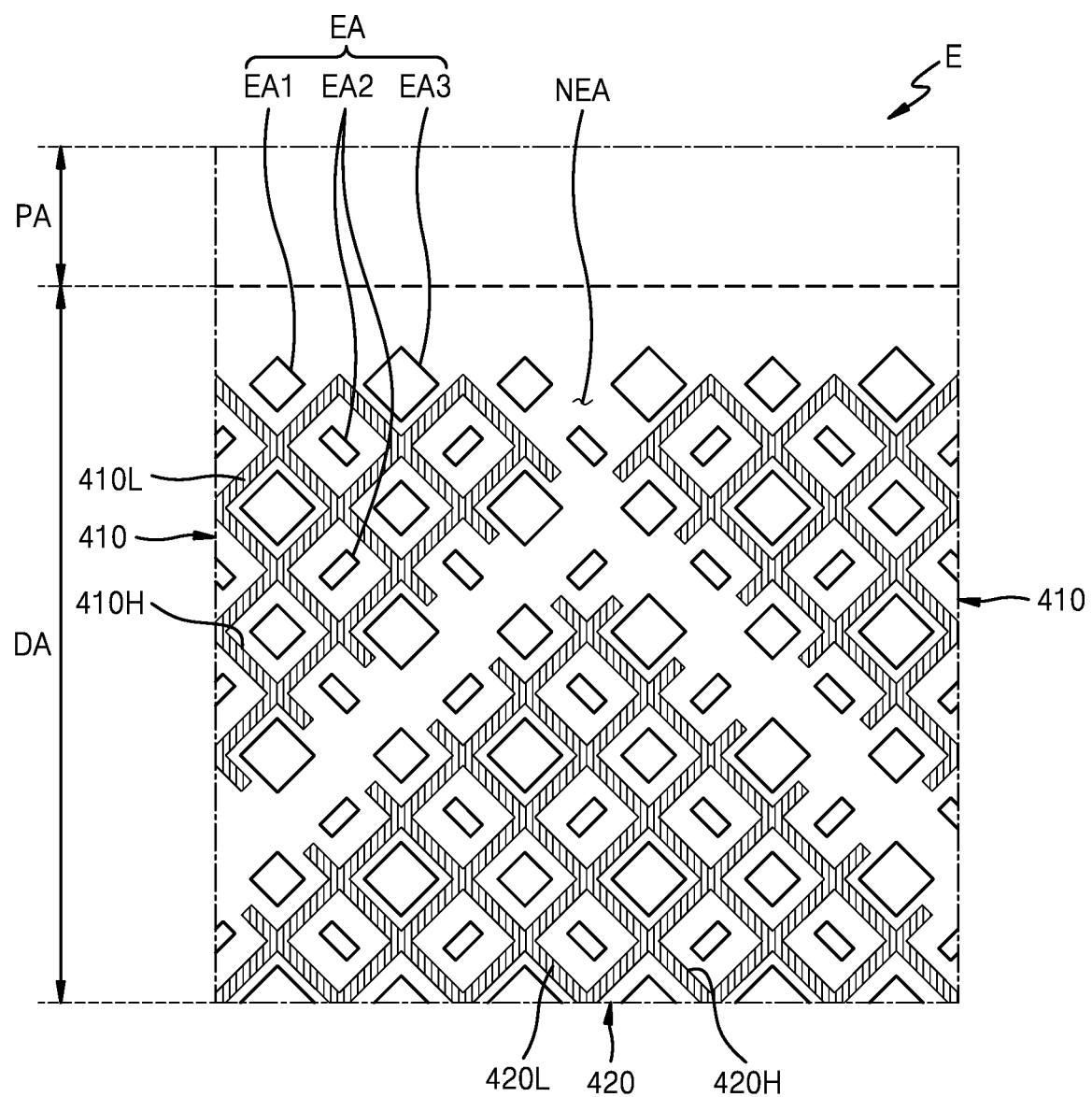
Figure 15E:
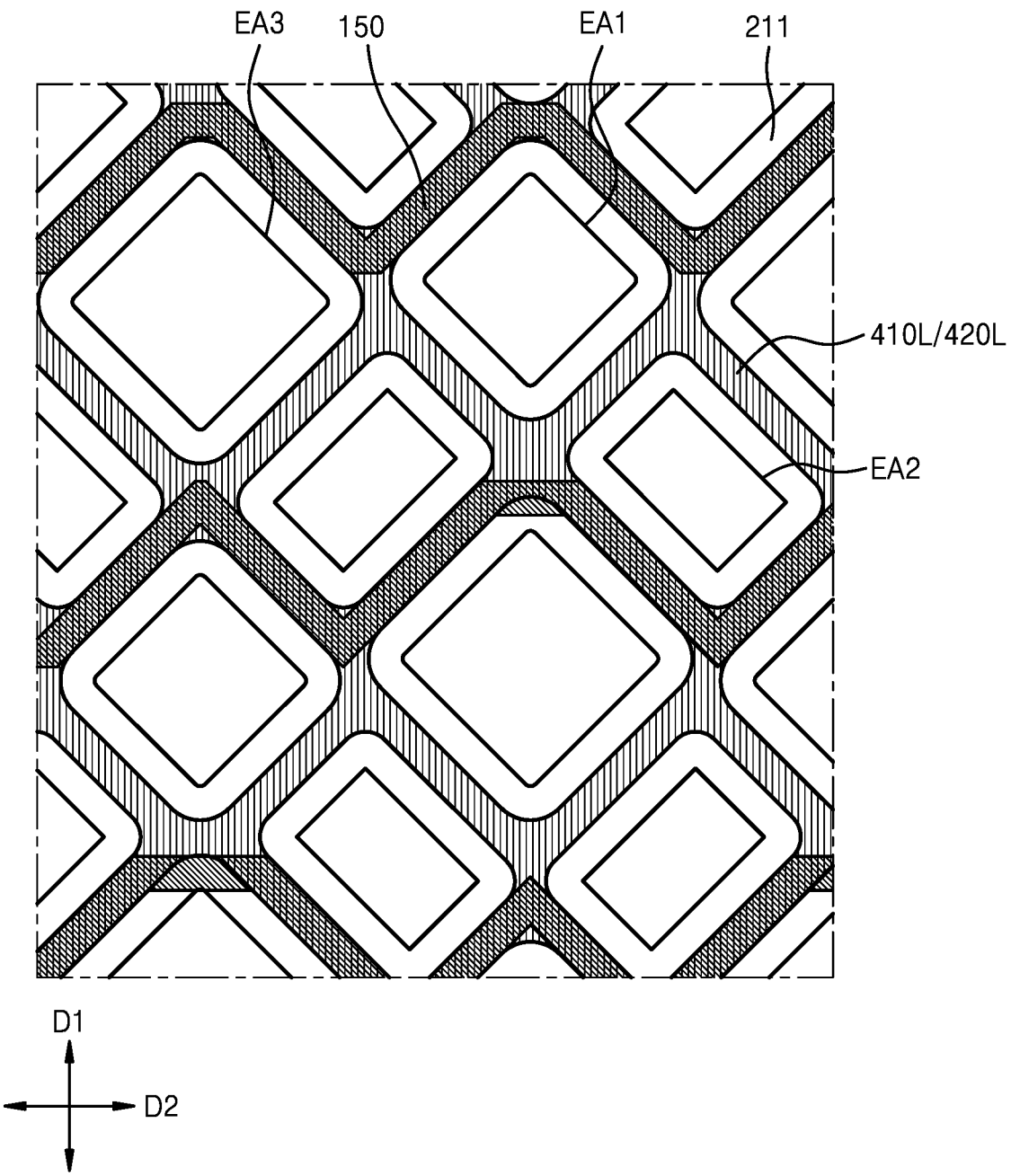
FIG. 15E is a plan view illustrating the layout of a shielding member and an input sensing layer.

Each of the first sensing electrode 410 and the second sensing electrode 420 may have a substantially rhombus shape or other shapes within the spirit and the scope of the disclosure. FIG. 15D is an enlarged plan view of a portion E of FIG. 15C.

As illustrated in FIG. 15D, the first sensing electrode 410 may include a grid line 410L of a grid structure including holes 410H. The holes 410H may overlap the emission area EA of the pixel PX. Similarly, the second sensing electrode 420 may include a grid line 420L of a grid structure including holes 420H. The hole 420H may overlap the emission area EA of the pixel PX. The emission areas EA may have various sizes. An emission area EA1 of a first pixel, an emission area EA2 of a second pixel, and an emission area EA3 of a third pixel may have different sizes. For example, an emission area that may emit red light, an emission area that may emit green light, and an emission area that may emit blue light may have different sizes. The holes 410H and 420H having the same size are illustrated in FIG. 15D. In one or more embodiments, the sizes of the holes 410H and 420H overlapping the emission areas EA may be different according to the sizes of the emission areas EA. The grid lines 410L of the first sensing electrodes 410 and the grid lines 420L of the second sensing electrodes 420 may be arranged located or disposed in the non-emission area NEA surrounding the emission areas EA. The grid lines 410L and 420L may have a line width of, for example, several micrometers.

As illustrated in FIG. 15E, some of the grid lines 410L of the first sensing electrodes 410 and the grid lines 420L of the second sensing electrodes 420 may overlap the shielding member 150.

FIGS. 16 to 19 are plan views illustrating the layout of the first line 200, the second line 250, and the sensing electrode according to an embodiment. In FIGS. 16 to 19, some electrodes and lines are omitted for convenience of illustration and explanation.

Figure 16:
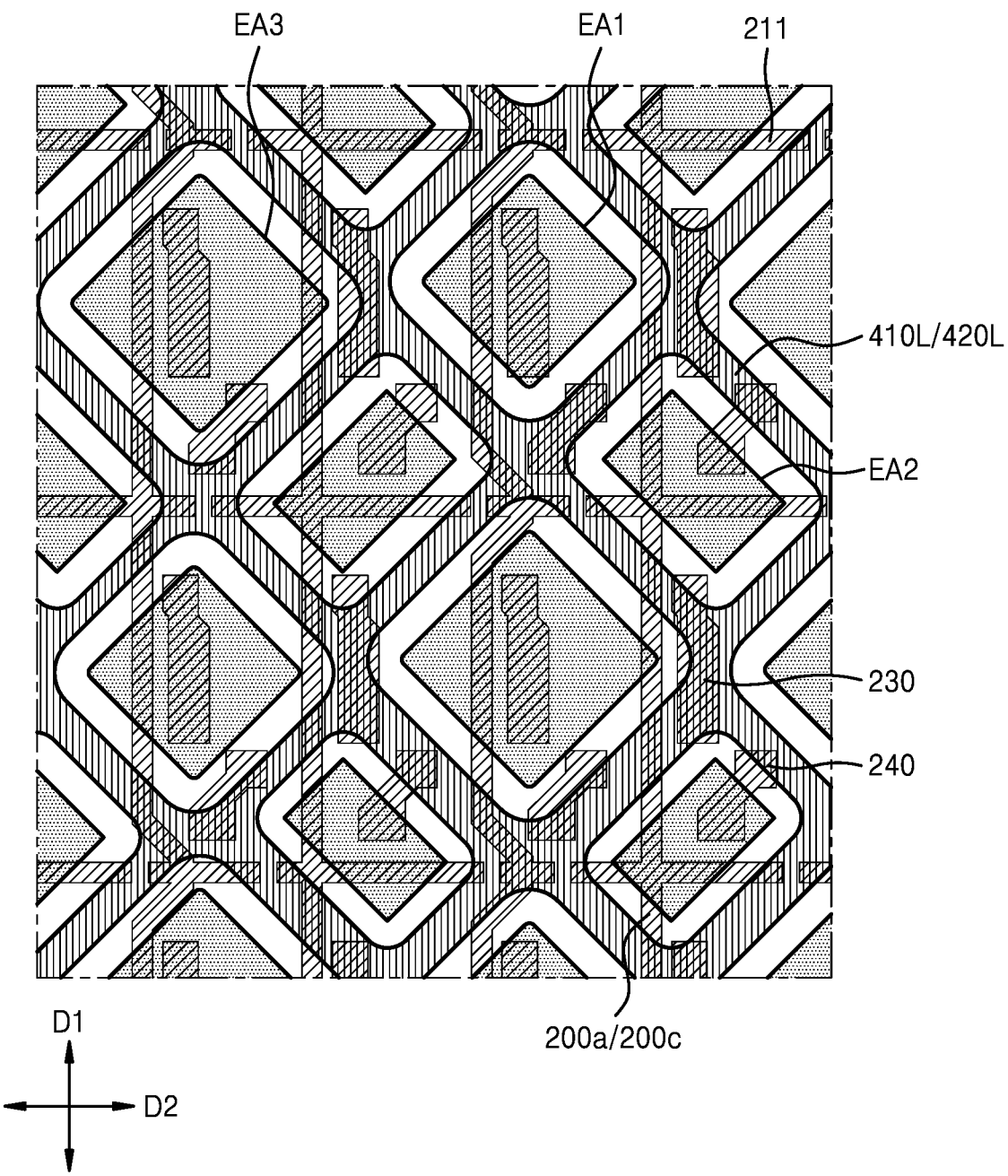
FIGS. 16 to 19 are plan views illustrating the layout of a first line, a second line, and a sensing electrode, according to an embodiment.

FIG. 16 illustrates the layout of the first portion 200a or the third portion 200c of the first line 200 arranged located or disposed in the first sub-area SS1 and the third sub-area SS3 in the first area S1 of the display area DA. Referring to FIG. 16, the emission areas EA1, EA2, and EA3 may overlap a part of the first line 200. The grid lines 410L of the first sensing electrodes 410 and the grid lines 420L of the second sensing electrodes 420 may overlap end portions of the first branches 211 of the first line 200, for example, the gap between the first branches 211. A part of the first line 200 may have not a linear shape but a substantially bent shape according to positions of the grid lines 410L of the first sensing electrodes 410 and the grid lines 420L of the second sensing electrodes 420. The first branch 211 may protrude from one side, or only one side, of the first line 200 or the first branches 211 may protrude from both sides of the first line 200, according to positions of the grid lines 410L of the first sensing electrodes 410 and the grid lines 420L of the second sensing electrodes 420. The length of the first branch 211 and the position of the gap between the first branches 211 may be changed in the pixel area according to positions of the grid lines 410L of the first sensing electrodes 410 and the grid lines 420L of the second sensing electrodes 420.

Figure 17:
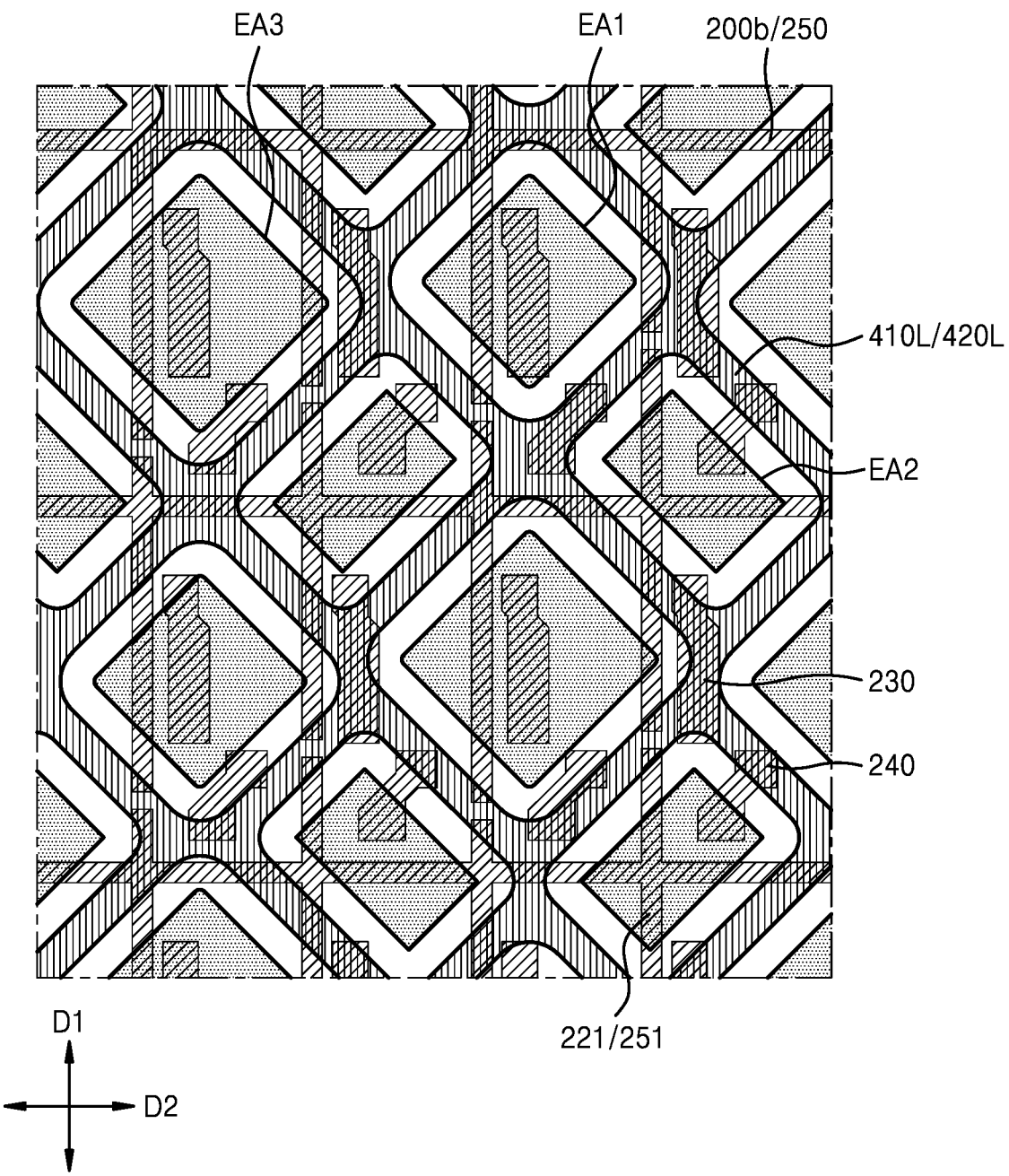

FIG. 17 illustrates the layout of the second portion 200b of the first line 200 arranged located or disposed in the second sub-area SS2 of the first area S1 or the second line 250 arranged located or disposed in the second area S2 in the display area DA. Referring to FIG. 17, the emission areas EA1, EA2, and EA3 may overlap a part of the first line 200 and the second line 250. The grid lines 410L of the first sensing electrodes 410 and the grid lines 420L of the second sensing electrodes 420 may overlap end portions of the second branches 221 of the first line 200, for example, the gap between the second branches 221, and end portions of the third branches 251 of the second line 250, for example, the gap between the third branches 251. A part of the first line 200 and a part of the second line 250 may have not a linear shape but a substantially bent shape according to positions of the grid lines 410L of the first sensing electrodes 410 and the grid lines 420L of the second sensing electrodes 420. The length of the second branch 221 and third branches 251 and the position of the gap between the second branches 221 and between the third branches 251 may be changed in the pixel area according to positions of the grid lines 410L of the first sensing electrodes 410 and the grid lines 420L of the second sensing electrodes 420.

Figure 18:
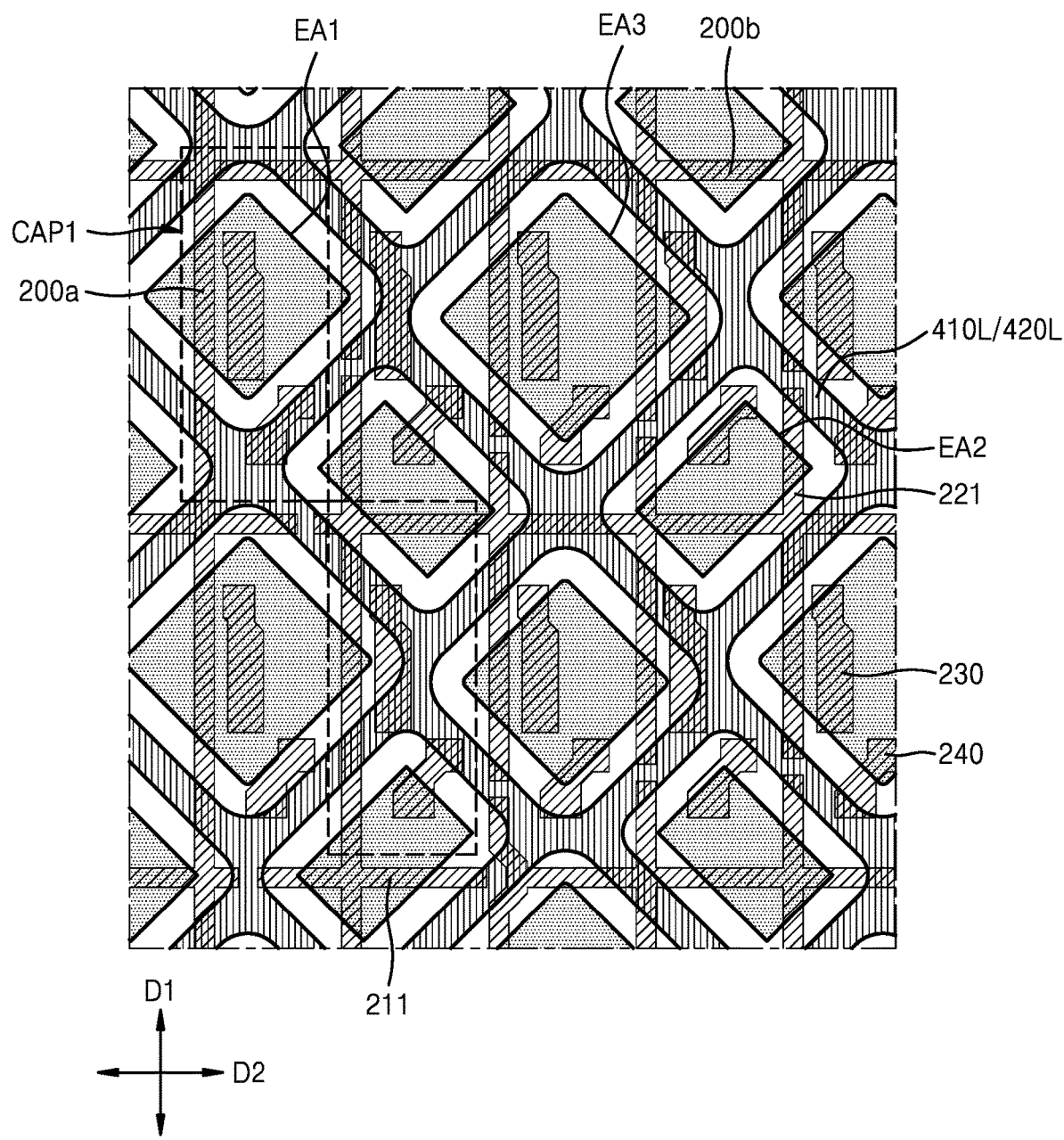
Figure 19:
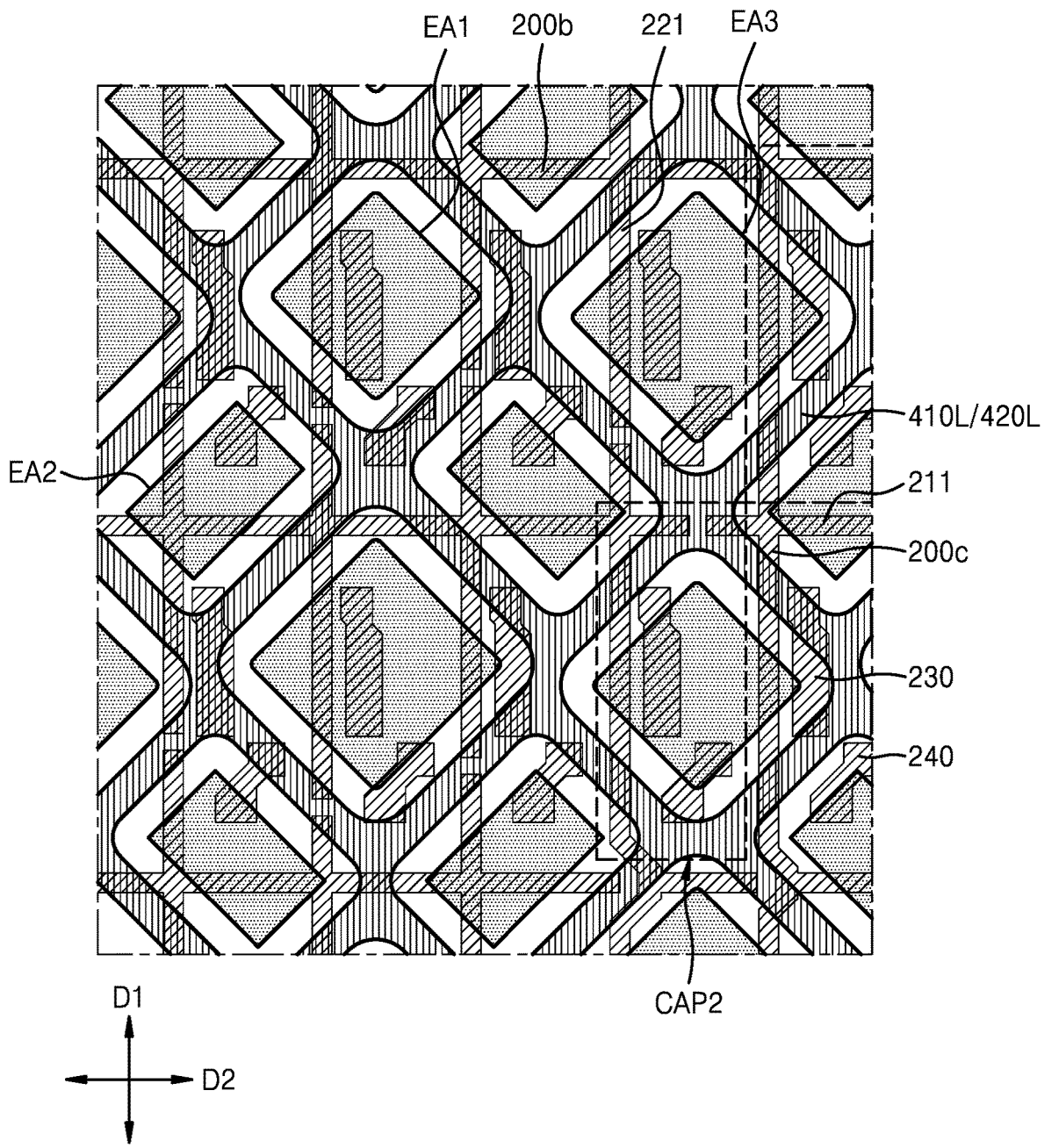

FIG. 18 is a plan view of a portion in which the first portion 200a of the first line 200 may be bent to the second portion 200b, and FIG. 19 is a plan view of a portion in which the second portion 200b of the first line 200 may be bent to the third portion 200c. Referring to FIGS. 18 and 19, the first portion 200a and the second portion 200b of the first line 200, or the third portion 200c and the second portion 200b of the first line 200 may be arranged located or disposed together in a pixel area of a position at which the first line 200 may be bent. Similar to those in FIGS. 16 and 17, the length of first branches 211, the position of the gap between the first branches 211, the length of the second branch 221, and the position of the gap between the second branches 221 may be changed in the pixel area according to positions of the grid lines 410L of the first sensing electrodes 410 and the grid lines 420L of the second sensing electrodes 420.

As illustrated in FIG. 18, the first portion 200a of the first line 200 parallel to the second data line DL2 and the second portion 200b of the first line 200 parallel to the second scan line 122 and overlapping the initialization voltage line 124 may be arranged located or disposed in a pixel area CAP1 in which the first portion 200a of the first line 200 may be bent to the second portion 200b. As illustrated in FIG. 19, the third portion 200c of the first line 200 parallel to the first data line DL1 and the first branch 211 protruding from the third portion 200c of the first line 200 parallel to the second scan line 122 and overlapping the initialization voltage line 124 may be arranged located or disposed in a pixel area CAP2 in which the second portion 200b of the first line 200 may be bent to the third portion 200c.

According to one or more embodiments, a connection line that may transfer a data signal to the data line may be arranged, located or disposed in the display area, thereby reducing the dead area of the display apparatus. As an example, a change in the data signal of the data line to which the connection line may be electrically connected may be minimized by blocking the electrical signal between the connection line and other lines affecting the connection line, thereby preventing a change in image quality. However, the scope of the disclosure is not limited by these effects.

It should be understood that embodiments described herein should be considered in a descriptive sense only and not for purposes of limitation. Descriptions of features or aspects within embodiments should typically be applicable to other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
 a substrate including a display area in which display elements are disposed and a peripheral area outside the display area;
 a data line disposed in the display area of the substrate;
 a first voltage line extending in parallel to the data line;

a scan line extending in a direction perpendicular to the data line;

a second voltage line extending in parallel to the scan line; and a line disposed in the display area of the substrate, and extending in parallel to the data line or the scan line, wherein the second voltage line is disposed on a layer between the scan line and the line, and a portion of the line parallel to the scan line overlaps the second voltage line.

2. The display apparatus of claim 1, wherein the line includes a segment protruding in a direction perpendicular to an extension direction of the line, and the segment of the line is a branch.

3. The display apparatus of claim 1, wherein a width of the second voltage line is greater than a width of the line.

4. The display apparatus of claim 1, wherein the second voltage line is spaced apart from the scan line.

5. The display apparatus of claim 1, wherein the first voltage line is disposed on a layer between the scan line and the line, and includes a protrusion protruding in an extension direction of the scan line and overlapping the scan line.

6. The display apparatus of claim 1, wherein the first voltage line and the second voltage line are disposed on different layers.

7. The display apparatus of claim 1, further comprising:

a first transistor including a first semiconductor layer and a first gate electrode;

a second transistor including a second semiconductor layer and a second gate electrode, one end of the second semiconductor layer being electrically connected to the first gate electrode of the first transistor;

a node electrode electrically connected to the first gate electrode of the first transistor and the one end of the second semiconductor layer of the second transistor; and an electrode pattern electrically connected to the first voltage line and overlapping the node electrode, the electrode pattern and the line being disposed on a same layer.

8. The display apparatus of claim 2, further comprising a sensing electrode disposed above the line, wherein the sensing electrode includes a grid line, and the grid line overlaps an end portion of the segment of the line.

9. A display apparatus comprising:

a substrate including a display area in which display elements are disposed and a peripheral area outside the display area;

a data line disposed in the display area of the substrate;

a first voltage line extending in parallel to the data line;

a scan line extending in a direction perpendicular to the data line;

a second voltage line extending in parallel to the scan line; and a line disposed in the display area of the substrate, extending in parallel to the data line, and including a segment protruding in the direction perpendicular to the data line and overlapping the second voltage line, wherein the second voltage line is disposed on a layer between the scan line and the line.

10. The display apparatus of claim 9, wherein the segment of the line is a branch.

11. The display apparatus of claim 9, wherein a width of the second voltage line is greater than a width of the line.

12. The display apparatus of claim 9, wherein the second voltage line is spaced apart from the scan line.

13. The display apparatus of claim 9, wherein the first voltage line is disposed on a layer between the scan line and the line, and includes a protrusion protruding in an extension direction of the scan line and overlapping the scan line.

14. The display apparatus of claim 9, wherein the first voltage line and the second voltage line are disposed on different layers.

15. The display apparatus of claim 9, further comprising a sensing electrode disposed above the line, wherein the sensing electrode includes a grid line, and the grid line overlaps an end portion of the segment of the line.

16. The display apparatus of claim 9, further comprising a second data line spaced apart from the data line, wherein the line is electrically connected to the data line or the second data line.

17. A display apparatus comprising:

a substrate including a display area in which display elements are disposed and a peripheral area outside the display area;

a data line disposed in the display area of the substrate;

a first voltage line extending in parallel to the data line;

a scan line extending in a direction perpendicular to the data line;

a second voltage line extending in parallel to the scan line; and a line disposed in the display area of the substrate, extending in parallel to the scan line, overlapping the second voltage line, and including a segment protruding in the direction of the data line, wherein the second voltage line is disposed on a layer between the scan line and the line.

18. The display apparatus of claim 17, wherein the segment of the line is a branch.

19. The display apparatus of claim 17, wherein a width of the second voltage line is greater than a width of the line.

20. The display apparatus of claim 17, wherein the second voltage line is spaced apart from the scan line.

21. The display apparatus of claim 17, wherein the first voltage line is disposed on a layer between the scan line and the line, and includes a protrusion protruding in an extension direction of the scan line and overlapping the scan line.

22. The display apparatus of claim 17, wherein the first voltage line and the second voltage line are disposed on different layers.

23. The display apparatus of claim 17, further comprising a sensing electrode disposed above the line, wherein the sensing electrode includes a grid line, and the grid line overlaps an end portion of the segment of the line.

* * * * *